(12) United States Patent
Rhie

(10) Patent No.: US 9,202,578 B2
(45) Date of Patent: Dec. 1, 2015

(54) VERTICAL GATE STACKED NAND AND ROW DECODER FOR ERASE OPERATION

(71) Applicant: Conversant Intellectual Property Management Inc., Ottawa (CA)

(72) Inventor: Hyoung Seub Rhie, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 40 days.

(21) Appl. No.: 14/044,449

(22) Filed: Oct. 2, 2013

(65) Prior Publication Data

US 2015/0092494 A1 Apr. 2, 2015

(51) Int. Cl.
*G11C 16/16* (2006.01)
*G11C 16/04* (2006.01)
*G11C 16/14* (2006.01)

(52) U.S. Cl.
CPC ............ *G11C 16/16* (2013.01); *G11C 16/0483* (2013.01); *G11C 16/14* (2013.01)

(58) Field of Classification Search
CPC ..................................................... G11C 16/16
USPC ........................................ 365/185.33, 185.11
See application file for complete search history.

(56) References Cited

U.S. PATENT DOCUMENTS

| | | | | |
|---|---|---|---|---|
| 8,274,827 B2 * | 9/2012 | Shirota et al. | ............ | 365/185.17 |
| 8,902,663 B1 * | 12/2014 | Or-Bach et al. | .......... | 365/185.18 |
| 2008/0158971 A1 * | 7/2008 | Lee | ........................... | 365/185.17 |
| 2012/0181699 A1 | 7/2012 | Chen et al. | | |
| 2012/0182802 A1 | 7/2012 | Hung et al. | | |
| 2012/0182806 A1 | 7/2012 | Chen et al. | | |
| 2012/0182807 A1 * | 7/2012 | Lue | .......................... | 365/185.18 |
| 2013/0248974 A1 * | 9/2013 | Alsmeier et al. | .............. | 257/321 |
| 2014/0189258 A1 * | 7/2014 | Aritome | ........................ | 711/147 |
| 2014/0192594 A1 * | 7/2014 | Lue | ........................... | 365/185.11 |
| 2014/0247671 A1 * | 9/2014 | Ito et al. | ................... | 365/185.23 |
| 2015/0023103 A1 * | 1/2015 | Aritome | ................... | 365/185.12 |

OTHER PUBLICATIONS

U.S. Appl. No. 13/830,135 to Rhie, Hyoung Seub entitled "Integrated Erase Voltage Path for Multiple Cell Substrates in Nonvolatile Memory Devices", (filed Mar. 14, 2013).
Lue, et al., "A Novel Junction-Free BE-SONOS NAND Flash"; Emerging Central Lab, Technology Development Center, Macronix International Co., Ltd.; 2008 Symposium on VLSI Technology Digest of Technical Papers; IEEE; 2008, 140-141.
Bux, Werner, "Performance Evaluation of the Write Operation in Flash-Based Solid-State Drives", IBM Research, Zurich, Switzerland, 30 pp., Nov. 23, 2009.

(Continued)

*Primary Examiner* — Son Mai
(74) *Attorney, Agent, or Firm* — Daniel Hammond

(57) ABSTRACT

A three-dimensional integrated circuit non-volatile memory array includes a memory array with multiple vertical gate NAND memory cell strings formed in a different vertical layers over a substrate which share a common set of word lines, where different groupings of NAND memory cell strings formed between dedicated pairings of source line structures and bit line structures form separately erasable blocks which are addressed and erased by applying an erase voltage to the source line structure of the erase block being erased while applying a ground voltage to the other source line structures in the array and a high pass voltage to the bit line structures in the array.

21 Claims, 14 Drawing Sheets

(56) References Cited

OTHER PUBLICATIONS

Hu, et al, "The Fundamental Limit of Flash Random Write Performance: Understanding, Analysis and Performance Modelling", 16 pp., Mar. 31, 2010.
Jagmohan, et al., "Write Amplification Reduction in NAND Flash through Multi-Write Coding", IBM T.J. Watson Research Center, IEEE, 2010, 6 pp.
Tanaka, et al., "Bit Cost Scalable Technology with Punch and Plug Process for Ultra High Density Flash Memory", Center for Semiconductor Research and Development and Process and Manufacturing Engineering Center, Toshiba Corporation, Semiconductor Company, 2007 Symposium on VLSI Technology Digest of Technical Papers, 2007, 14-15.
Jang, et al., "Vertical Cell Array using TCAT (Terabit Cell Array Transistor) Technology for Ultra High Density NAND Flash Memory" Advanced Technology Development Team 2 and Process Development Team, Memory R and D Center, Memory Division, Samsung Electronics Co. Ltd., 2009 Symposium on VLSI Technology Digest of Technical Papers, 2009, 192-193.
Fukuzumi, et al., "Optimal Integration and Characteristics of Vertical Array Devices for Ultra-High Density, Bit-Cost Scalable Flash Memory", Center for Semiconductor Research and Development, Toshiba Corporation, Semiconductor Company, Toshiba Information Systems (Japan) Corporation, 2007, 449-452.
Hubert, et al., "A Stacked SONOS Technology, up to 4 Levels and 6nm Crystalline Nanowires, with Gate-all-around or Independent Gates (-Flash), Suitable for Full 3D Integration", CEA-LETI, MINATEC, STMicroelectronics, IEEE, 2009, 4 pp.
Lue, et al., "A Highly Scalable 8-Layer 3D Vertical-Gate (VG) TFT NAND Flash Using Junction-Free Buried Channel BE-SONOS Device", Emerging Central Lab, Technology Development Center, Macronix International Co., Ltd., 2010 Symposium on VLSI Technology Digest of Technical Papers, 2010, 131-132.
Chen, et al., "A Highly Pitch Scalable 3D Vertical Gate (VG) NAND Flash Decoded by a Novel Self-Aligned Independently Controlled Double Gate (IDG) String Select Transistor (SSL)", Emerging Central Lab, Technology Development Center, Macronix International Co., Ltd., 2012 Symposium on VLSI Technology Digest of Technical Papers, 2012, 91-92.
Chang, et al., "Memory Architecture of 3D Vertical Gate (3DVG) NAND Flash Using Plural Island-Gate SSL Decoding Method and Study of It's Program Inhibit Characteristics", Macronix International Co., Ltd., Emerging Central Lab, Technology Development Center, Design Center, IEEE, 2012, 4 pp.
Chen, et al., "A Highly Scalable 8-layer Vertical Gate 3D NAND with Split-page Bit Line Layout and Efficient Binary-sum MiLC (Minimal Incremental Layer Cost) Staircase Contacts", Macronix International Co., Ltd., IEEE, 2012, 4 pp.
Hung, et al., "Design Innovations to Optimize the 3D Stackable Vertical Gate (VG) NAND Flash", Macronix International Co., Ltd., IEEE, 2012, 4 pp.
Kim, et al., "Three-Dimensional NAND Flash Architecture Design Based on Single-Crystalline STacked ARray", IEEE Transactions on Electron Devices, vol. 59, No. 1, Jan. 2012, 35-45.

* cited by examiner

US 9,202,578 B2

VERTICAL GATE STACKED NAND AND ROW DECODER FOR ERASE OPERATION

BACKGROUND OF THE INVENTION

1. Field of the Invention

The present invention is directed in general to integrated circuit devices and methods for manufacturing same. In one aspect, the present invention relates to nonvolatile memory devices, such as NAND flash memory and other types of flash memory.

2. Description of the Related Art

With the increasing demand for nonvolatile data storage to support applications, such as video or audio players, digital cameras, and other computerized devices, there continues to be interest in having nonvolatile memory devices progress over time towards having smaller sizes, larger memory capacity, and improved performance. For example, the need to reduce manufacturing costs per data bit is driving the NAND flash industry to continuously to reduce the size of the cell transistors. But as fabrication process limitations (for example, limitations imposed by photolithography tools) limit the ability to reduce physical transistor sizes, there have been structural and/or design schemes proposed to increase memory density, such as, for example, stacking NAND cells in a direction perpendicular to the chip surface, thereby reducing the effective chip area per data bit without requiring shrinkage of the physical cell transistor size. However, there continue to be challenges associated with designing, fabricating, and operating vertical NAND flash memory devices.

BRIEF DESCRIPTION OF THE DRAWINGS

The present invention may be understood, and its numerous objects, features and advantages obtained, when the following detailed description is considered in conjunction with the following drawings, in which:

FIG. 1b illustrates a simplified cross sectional view of the NAND flash memory cell transistors shown in FIG. 1a;

Figure 1A:
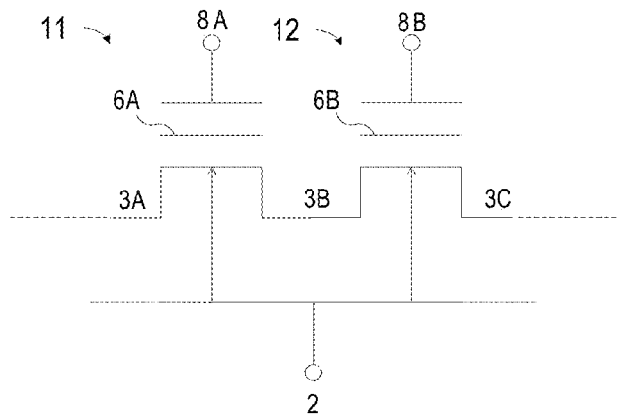
FIG. 1a illustrates a simplified circuit schematic representation of two serially connected NAND flash memory cell transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In a three-dimensional vertical gate NAND flash memory device, a stacked memory architecture and decoding scheme are provided to select individual strings and pages for read and program operation and to provide sub-block erase operations which improve write amplification to reduce the movement of user data and increase the life of reliable write operations. In selected embodiments, write amplification performance may be improved without reducing the number of cells per string by separately pairing a dedicated source line structure and string select structure with a corresponding group of NAND strings to enable sub-block erase operations which effectively reduce the erase block size-to-page size ratio. In other embodiments, the flash memory device includes row decoder circuit for selecting one or more erase blocks of memory cells for erase operation, where the row decoder includes first and second block decoders. In the first block decoder, M row address bits are processed to select a group of blocks of memory cells in the memory array which share a common set of word lines from a plurality of similarly dimension-defined groups of blocks of memory cells in the memory array. In the second block decoder, L row address bits are processed to select a source line structure and a string select structure in a selected group of blocks from a plurality of source line structures and string select structures in the selected group of blocks, thereby selecting a plurality of NAND memory cell strings connected between the selected source line structure and string select structure as an erase block of memory cells for erase operation. In particular, the second block decoder generates a selection signal that is selected from $2^L$ selection signals that is supplied to a string select line voltage switching block and a source line voltage switching block. At the source line voltage switching block, the selection signal is processed as a source line select signal to generate an erase voltage V_erase for connection to the selected source line structure. And at the string select line voltage switching block, the selection signal is processed as a string select signal to generate a high pass voltage Vpass for connection to the selected string select structure.

In this disclosure, an improved system, apparatus, and fabrication method are described for fabricating vertical gate NAND flash memory devices with separate source lines that define small erase blocks that address various problems in the art where various limitations and disadvantages of conventional solutions and technologies will become apparent to one of skill in the art after reviewing the remainder of the present application with reference to the drawings and detailed description provided herein. For example, there are challenges with reducing the write amplification performance of NAND flash memories by reducing the erase block size-to-page size ratio while retaining the ability to read and program individual strings and pages, not only from the increased cell area and bit costs that would otherwise occur from simply reducing the string size, but also from the technical challenges imposed by inserting additional non-data-bearing parts (for example, string select and ground select transistors, drain contacts, and source contacts) and associated control signaling for such parts. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings and representations of a flash memory device and decoding circuits without including every device feature, geometry, or circuit detail in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

To provide a contextual framework for selected embodiments of the present disclosure, reference is now made to FIG. 1a which illustrates a simplified circuit schematic representation 1 of two serially connected NAND Flash cell transistors 11, 12. Each of the transistors 11, 12 include a control gate 8A, 8B, a floating node (or storage nodes) 6A, 6B, and source/drain nodes 3A, 3B, 3C, and the cell body node 2. The NAND flash memory cell transistors 11, 12 can perform erase, program, and read operations by applying appropriate voltages to the indicated nodes, thereby trapping electrons in the charge storage nodes 6A, 6B to modify the threshold voltage of each cell transistor to different levels, depending on the data (0 or 1) stored in the cell. The threshold voltage of the each cell transistor determines the resistance of the channel 4A, 4B. In selected embodiments where each NAND Flash memory cell stores two logic states (data '1' and data '0'), each memory cell corresponds to one bit, but in other embodiments where NAND Flash memory cells can be programmed to four or more threshold levels, multiple bits can be stored in each physical cell, which is referred to as a multi-level cell (MLC). With NAND flash memory cells, data is typically erased and programmed using Fowler-Nordheim (F-N) tunneling to deliver or remove charge from the floating gate/charge storage nodes 6A, 6B by applying a suitably large voltage to the control gate 8A, 8B (for example, 20V) while holding the substrate 2 and source/drain regions 3 to a lower voltage (for example, ground or 0V) to induce the formation of a channel 4A, 4B under the tunnel dielectric 5 which injects electrons into the floating gate/charge storage nodes 6A, 6B. As a result, the cell threshold voltage Vth of the programmed cell is shifted in the positive direction.

In order to read cell data, the control gate 8A, 8B is biased to a lower voltage (for example, Vss=0V). If the cell is in an erased state, the erased cell has a negative threshold voltage so that the cell current (Icell) from the drain 3B to the source 3A flows under the given read bias condition. On the other hand, if the cell is in a programmed state, the programmed cell has a positive threshold voltage so that there is no cell current from the drain 3B to the source 3A under read bias condition. An erased cell (on-cell) is thus read or sensed as data '1' and a programmed cell (off-cell) is read or sensed as data '0'.

During an erase operation, the control gate 8A, 8B of a cell is biased to the low voltage (for example, Vss=0V) while the cell body 2 is biased to an erase voltage V_erase (for example 18 V) and the source and drain 3A/3B of the cell are floated. In the erase bias conditions, no conductive inversion layer channel 4A, 4B of n-type conductivity exists because the cell transistors are strongly turned off, in which case the trapped electrons in the floating node 6A, 6B are emitted uniformly to the substrate 2 through the tunnel dielectric 5. As a result, the cell threshold voltage (Vth) of the erased cell becomes negative. In other words, the erased cell transistor is in an on-state if the gate bias of the control gate is 0V. Because of the cell body bias requirement for erase bias conditions, erase operations are not applied to individual NAND Flash memory cells, but are instead applied to erase entire blocks of cells.

Figure 1B:
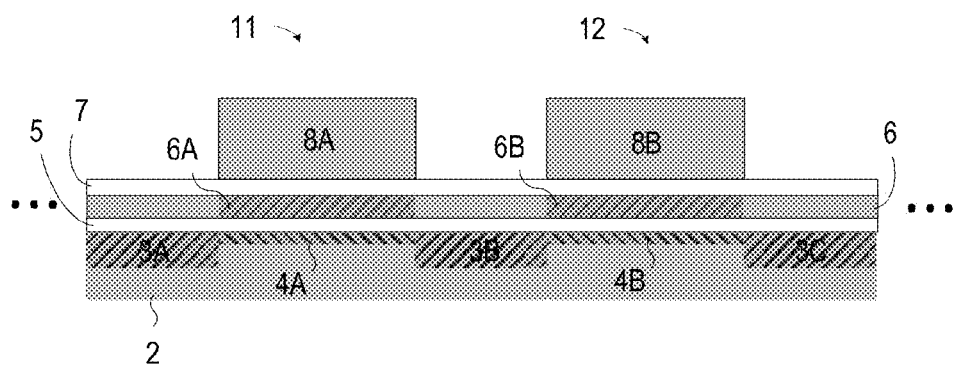

To further illustrate the contextual framework for selected embodiments of the present disclosure, reference is now made to FIG. 1b which illustrates a simplified cross sectional view of the NAND flash memory cell transistors 11, 12 shown in FIG. 1a formed in a semiconductor substrate or string structure. The illustrated NAND Flash cell includes a semiconductor body or well layer 2 formed with an appropriate semiconductor material (for example, monocrystalline or polycrystalline silicon) having a first polarity type (for example, p-type silicon), such as a bulk semiconductor substrate, semiconductor-on-insulator (SOI) substrate, or a polysilicon layer. Multiple semiconductor substrate or string structures can be vertically stacked over a bulk or SOI substrate and separated from one another by interlayer dielectric layers.

On or around the semiconductor body or well layer 2, a multi-layered gate dielectric structure 5-7 is formed for each transistor 11, 12, including a tunnel dielectric layer 5 that is formed (for example, deposited or grown) on the semiconductor body/well layer 2, a charge storage layer 6 that is formed on the tunnel dielectric 5, and a coupling dielectric 7 (a.k.a., blocking dielectric) that is formed (for example, deposited) on the charge storage layer 6. Sandwiched between the tunnel dielectric layer 5 and the coupling dielectric layer 7, the charge storage layer 6 performs a charge trap function by including charge storage nodes or locations 6A, 6B where electrons are trapped. In selected embodiments, the charge storage nodes 6A, 6B may be formed as a SONOS (Silicon-Oxide-Nitride-Oxide-Silicon) structure, though other charge storage nodes structures may be used. As will be appreciated, the charge storage nodes 6A, 6B are formed to prevent unintentional charge flow between adjacent cells, such as by forming the forming the charge storage layer 6 with dielectric charge trapping material or with conductive material in each cell which is isolated from adjacent cells (e.g., by patterned dielectric layers between adjacent floating gates). In selected floating gate embodiments (not shown), the charge storage layer 6 is patterned into separate floating gates that are isolated from one another. However, in embodiments where the charge storage layer 6 and storage nodes 6A, 6B are formed as a single continuous layer, the multi-layered gate dielectric structure 5-7 may be fabricated as a continuous thin film without patterned, isolated segments. On the multi-layered gate dielectric structure 5-7, patterned control gates 8A, 8B are formed, such as by depositing a polysilicon layer or other conductive control gate layer on the coupling dielectric 7.

In the semiconductor body/well layer 2, source/drain regions 3A-3C are formed using any desired technique. For example, the source/drain regions 3 may be formed by implanting or diffusing regions with appropriate polarity dopants (for example, n-type doping). In other embodiments, the source/drain regions 3 are not formed as permanently conducting implant regions, but instead have their conductivity controlled by applying electric fringe-fields from the control gates 8A, 8B. For example, a large bias applied at the control gates 8A, 8B can induce conductive inversion layers in the source/drain regions 3A-3C in the same manner as a channel inversion layer forms when a transistor is turned on. These types of cells are called "junction-free" or "junctionless" cells. In such junction-free cells, the channel regions 4A, 4B and the source/drain regions 3A, 3B, 3C are only conductive if the electric field between the charge storage node 6A, 6B and the substrate 2 is sufficiently large to induce an inversion layer. This electric field is caused by a combination of the charge stored in the charge storage layer 6A, 6B and the external bias that is applied to the control gate 8A, 8B.

Figure 2:
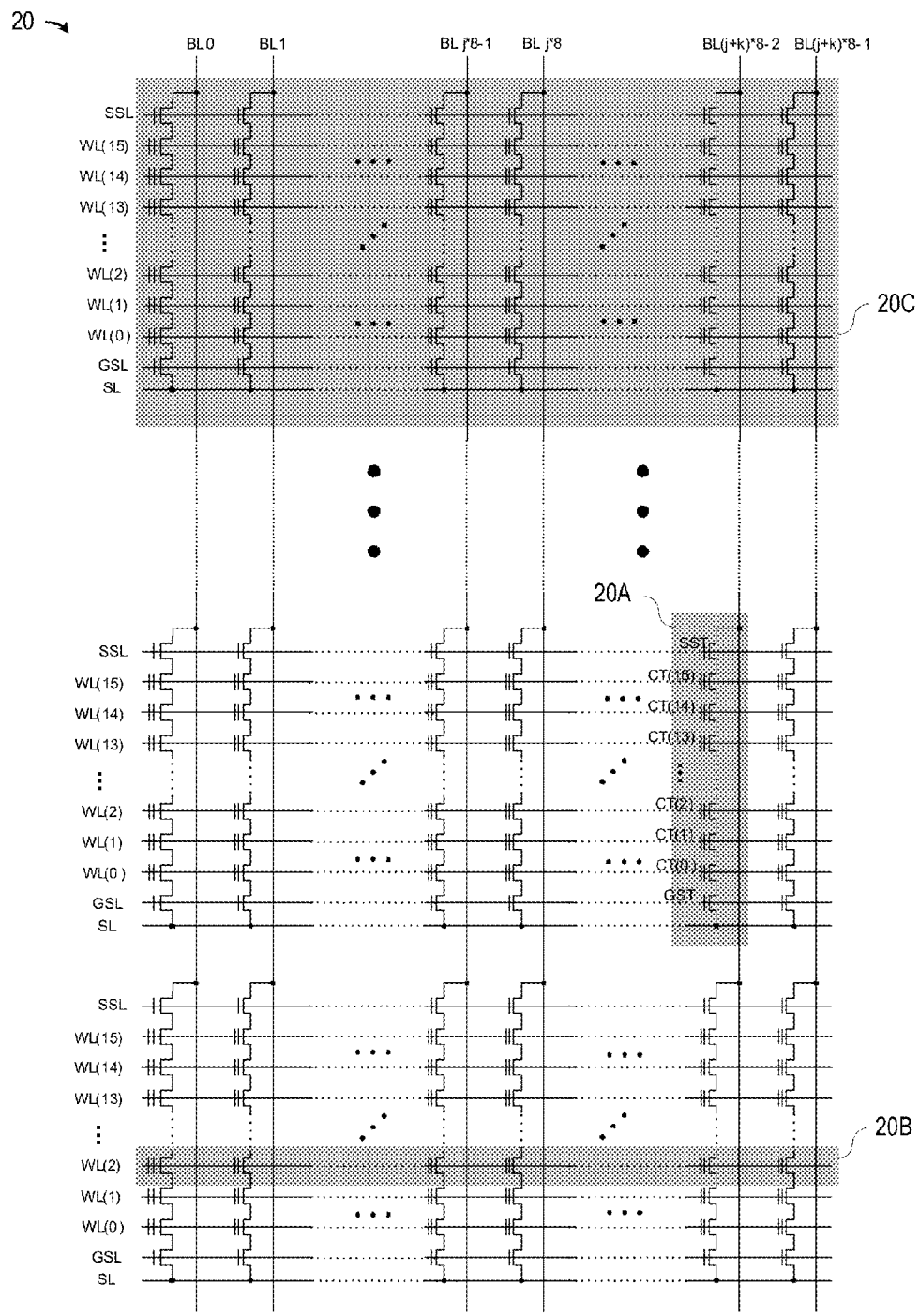
FIG. 2 illustrates a simplified circuit schematic representation of a NAND flash memory cell array in which a string, page, and block of data are identified.

Turning now to FIG. 2, there is shown a simplified circuit schematic of a plurality of NAND flash memory cells organized and arrayed into multiple rows and columns, where each column is connected to a respective bit line conductor (for example, BL0-BL(j+k)(8−1) and each row is connected to a respective word line conductor (for example, WL(0)-WL(15)). As depicted, the NAND flash memory cell array 20 includes a data string 20A, data page 20B, and data block 20C.

In the depicted NAND string 20A, the cells are connected in series in a group of a predetermined numbers of cells (for example, 16, 32 or 64). To connect each string to its corresponding source line (SL) and bit line (for example, BL(j+k)*(8−2), selection transistors are placed at the edges of the string. For example, the NAND cell string 20A includes at least one string select transistor (SST, SSL gate or SSL transistor) and at least one ground select transistor (GST, GSL gate or GSL transistor). The gate of the string select transistor (SST) is connected to a string select line (SSL), while the drain of a string select transistor (SST) is connected to a bit line for the string (for example, BL(j+k)*(8−2). The gate of a ground select transistor (GST) is connected to a ground select line (GSL), while the source of the ground select transistor (GST) is connected to a source line (SL or CSL) for the string. Connected in series between the string select transistor SST and ground select transistor GST is a plurality of memory cell transistors CT(i), each having a control gate connected to a respective word line WL(i). In the depicted configuration, the NAND string 20A shares the bit line contact with another string, and any desired number of memory cell transistors may be connected in a string so that the number of cells per string may vary with 4 cells per string, 8 cells per string, 16 cells per string, 32 cells per string, 64 cells per string, 128 cells per string, and so on. To specify a direction within the string 20A, the direction towards the string select line SSL of a string is referred to as "drain direction" or "drain side," and the direction towards the ground select line GSL of a string is referred to as "source direction" or "source side."

In the depicted NAND page 20B, the cells are addressed by a row address to specify the smallest unit of cells for which a read or program operation can be performed. In selected embodiments, the page 20B includes the cells connected to the same word line (for example, WL(2)). In other embodiments, the number of pages per word line depends upon to the storage capabilities of the memory cell. For example, the cells connected to a certain word line may be subdivided into multiple subgroups so that the array 20 includes multiple pages per word line, whereby each one of the multiple pages in one word line has a different row address. In the case of multiple bit storage in one physical cell, different bits can belong to different pages logically although they are physically located in the same cell transistor and thus connected to the same word line.

The NAND Flash array 20 may also be grouped into a series of blocks (for example, 20C) which are the smallest erasable entities in the array. For example, the depicted NAND flash block 20C includes all strings which share the same word lines, string select lines, and ground select lines. Stated another way, a block 20C includes all pages sharing the same string select lines and ground select lines. In other embodiments, different groupings of NAND flash cells may be used for the flash erase blocks.

Figure 3:
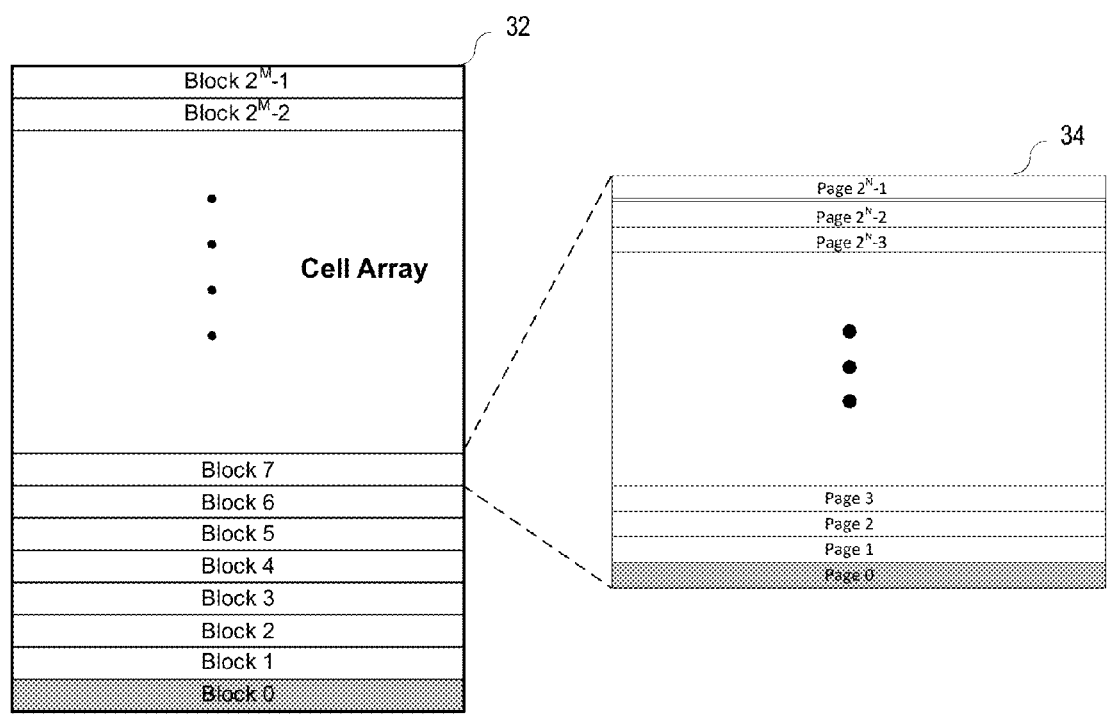
FIG. 3 illustrates a multi-block NAND flash cell array memory using a block and page addressing to support read, program, and erase operations.

To illustrate the block-base erase operations for a NAND flash array, reference is now made to FIG. 3 which shows a multi-block NAND flash memory 30 which uses a block and page addressing to support read, program, and erase operations. As depicted, the flash memory 30 is organizationally divided in blocks 32 and pages 34. The depicted flash memory 30 includes $2^M$ blocks, though more generally, there may be a power of two number of blocks within any flash memory. Each block (for example, Block 7) contains multiple pages 34 which are typically a power of two (for example 64, 128), though more generally, there may be $2^N$ pages in each block. Again, a page is the smallest addressable unit for reading and writing, and may include a main area for storing data and a spare area for error correction, system pointers, and/or other information relating to the data stored in the main area. Assuming that the row address is made of M bits for the block address and N bits for the page address, the multi-block NAND flash memory 30 includes $2^M$ erase blocks, with each block subdivided into $2^N$ programmable pages.

Figure 4:
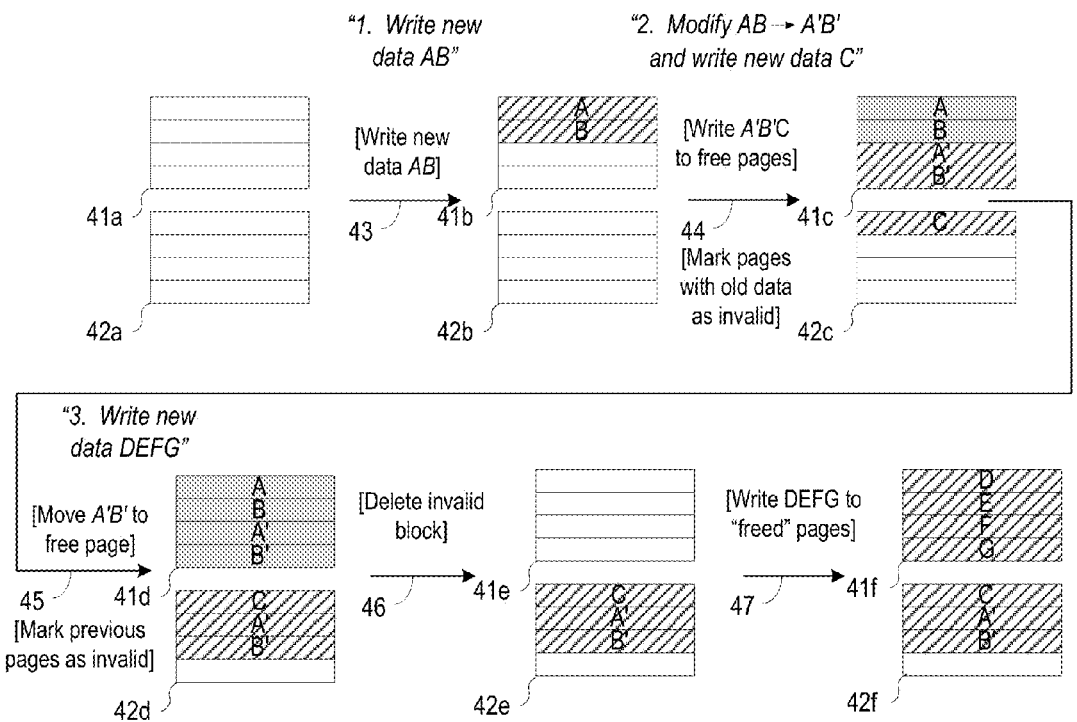
FIG. 4 illustrates a workflow sequence for writing and modifying data in a multi-block NAND flash cell array.

There are a number of challenges with programming and reading data in NAND Flash memories that arise from the requirement of using block-based erase operations to write or modify stored data. One such challenge is the write amplification (WA) phenomenon where the amount of physical data actually written to NAND Flash cells is larger than (for example, a multiple of) the logical amount of user data intended to be written to memory by the external user because flash memory must be erased in blocks before it can be rewritten, requiring the movement (or writing) of user data and metadata more than once and effectively reducing the life of reliable write operations. In addition to reducing the life of a flash memory, the multiplication of write operations also consumes bandwidth to the flash memory which mainly reduces random write performance to the SSD. To illustrate the asymmetry between the larger block erase operations and the smaller page sizes actually being written that contributes to the write amplification phenomenon, reference is now made to FIG. 4 which shows a simplified example of a workflow sequence for writing new data and modifying of existing data in a NAND Flash memory 40 organized into two blocks 41, 42 of four pages per block. In the workflow sequence 40, data is written and modified in the multi-block NAND flash cell array 41-42 by writing new data to pages in memory (step 43), modifying existing data and writing new data in a new memory block (step 44), and moving data to the new block to erase the old block to make room for new data (steps 45-47). In the depicted workflow sequence 40, the three-step workflow sequence from the user's point of view is written in quotation marks, and the actual internal operation described by the boxes is hidden from the user and indicated with brackets.

In the initial memory configuration 41a, 42a, the erased (or never programmed) pages are shown as white boxes. In the first step of the workflow (listed as step 1 in the workflow and shown at the memory configuration 41b, 42b), two pages are written with data A and B designating different sets of one-page's worth of binary data. As shown with the memory configuration 41b, 42b, the top two pages in the first block 41b are programmed with valid data A, B (as indicated with the cross-hatched shading). Because all pages are unprogrammed initially (as shown at the memory configuration 41a, 42a), the internal operation of the memory at the first step is identical to the user's intended operation.

At a subsequent point when the user modifies the previous data A, B to A', B' and also writes new data C, the memory configuration 41c, 42c, shows that new pages are used to program the modified and new data. However, contrary to the operation that may logically appear to the user (listed as step 2 in the workflow), the original physical data A and B is not modified in their physical locations but is instead marked as invalid (as indicated with the grey shading), and the updated data A', B' is written to other free pages in the first block 41c (for example, using an out-of-place write sequence). In addition, the new data C is written to a free page in the second block 42c (since the first block 41c is full in this simplified example).

As the invalid pages (indicated with gray shading) accumulate in a block with the ongoing use of the flash memory, the flash memory may reach a minimum threshold of free or unprogrammed pages, at which point invalid pages in the block are "freed" or erased to make them available for additional write operations. The process of "freeing" pages may arise when a new data write operation is performed that exceeds the available number of free pages. In an example replacement algorithm known as a "garbage collection" replacement algorithm, when the user writes new data DEFG to the memory (listed as step 3 in the workflow) that is too big for the three available pages, the flash memory frees space in the first block 41d with a sequence of separate steps. First, valid data A', B' is transferred from the first block 41d to some other location (for example, the second block 42d) and the source pages in the first block 41d are then marked as invalid (as shown at the memory configuration 41d, 42d). Once this is done, the invalid pages (indicated with gray shading in the first block 41d) are deleted or erased in a single block-based erase operation (as shown at the memory configuration 41e, 42e). By erasing the first block 41e, its pages are freed and available again for writing the new data DEFG to the first block 41f while retaining the data CA'B' in the second block 42f (as shown at the memory configuration 41f, 42f). While it appears to the user that only four pages (DEFG) are being written to memory (at step 3 in the workflow), there are actually six pages of data being programmed (A'B'DEFG), resulting in a write amplification overhead factor of 1.5 which results from the asymmetry of the erase block size being larger than the programming page size.

In general, larger block sizes for the same page size (i.e., higher block-to-page size ratio) lead to higher write amplification on average that results from "unnecessary" movement of valid data for the purpose of block erasure which increases data traffic and decreases average performance. In particular, a write amplification factor greater than 1 can impact the longevity of the flash memory formed with NAND Flash cells which have a limited number of write/erase cycles. In addition, a write amplification factor greater than 1 indicates that more data than needed is being written, causing more write/erase cycles to be used which reduces longevity. Conversely, no write amplification would occur in the theoretical ideal case where the block size and page size are the same. Attempts to reduce the block-to-page size ratio and write amplification factor by reducing the string size has generally not been a viable solution since this would increase area overhead, thereby increasing bit costs. To the contrary, the trend in flash memory design has been in the opposite direction of increasing string sizes and thereby increasing the block-to-page size ratio.

Figure 5:
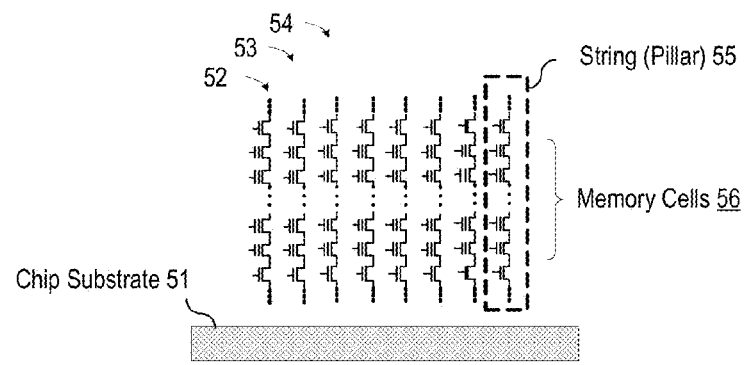
FIG. 5 illustrates a simplified cross-sectional schematic representation of a vertically stacked array of vertical channel NAND flash cell strings formed over a substrate.
Figure 6:
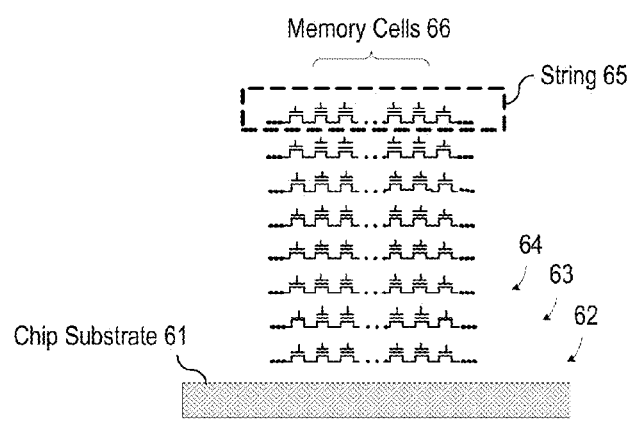
FIG. 6 illustrates a simplified cross-sectional schematic representation of a vertically stacked array of vertical gate NAND flash cell strings formed over a substrate.

The foregoing challenges with efficiently managing read, program, and erase operations in flash memories can be exacerbated with vertical or stacked flash memory designs which are increasingly being used to vertically stack multiple layers of NAND flash memory cells above the substrate, thereby increasing device density and reducing the effective chip area-per-data-bit metric without relying on reducing the physical cell transistor size. Generally speaking, there are two main types of stacked NAND flash memory device architectures. First and as illustrated in simplified cross-sectional schematic form in FIG. 5, a vertically stacked array 50 may be fabricated with vertical channel NAND flash cell strings 52-55 formed over a substrate 51 to run in a direction that is perpendicular or orthogonal to the chip substrate 51. In the vertical channel NAND architecture, the memory cells 56 belonging to the same string are stacked vertically on top of each other, and different strings 52-55 are arranged as pillars that are laterally positioned next to one another. By convention, the device architecture for the vertically stacked array 50 may be referred to as Vertical Channel NAND or VC NAND. Second and as illustrated in simplified cross-sectional schematic form in FIG. 6, a vertically stacked array 60 may be fabricated with vertical gate NAND flash cell strings 62-65 formed over a substrate 61 to run in a direction that is parallel to the chip substrate 61. In the VG NAND architecture, memory cells 66 belonging to the same string (for example, 62) are aligned in a direction parallel to the chip surface as in conventional NAND cells, but additional strings (for example, 63-65) are stacked vertically on top of each other. By convention, the device architecture for the vertically stacked array 60 may be referred to as Vertical Gate NAND or VG NAND.

Figure 7:
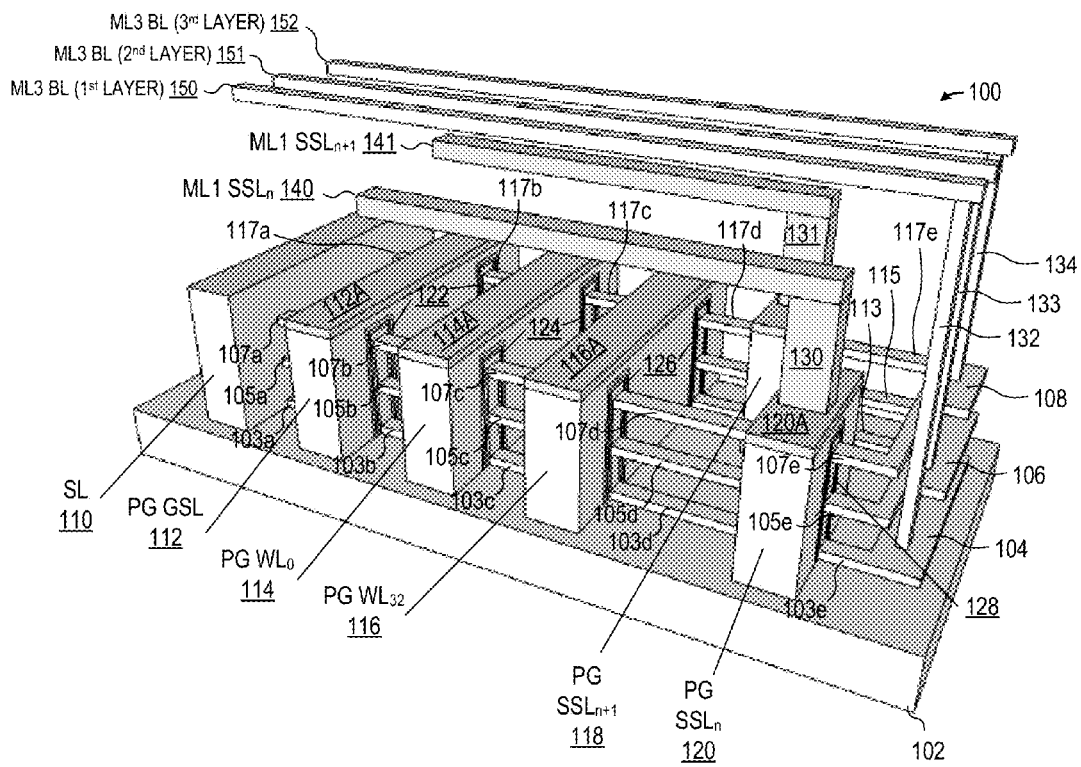
FIG. 7 illustrates a simplified schematic diagram of a three-dimensional vertical gate NAND flash memory array architecture with island-type string select transistors and a common source line for implementing an example block erase operation.

Turning now to FIG. 7, there is shown a three-dimensional array architecture of a vertical gate NAND flash memory 100 with island-type string select transistors for implementing an example block erase operation. In the VG NAND flash memory 100, a plurality of stacked cell strings 103, 105, 107, 113, 115, 117 are formed over a chip substrate 102 to extend through separate word line gate structures 114, 116, with each cell string running in a direction that is parallel to the surface of the chip substrate 102. The layout of the VG NAND 100 resembles a conventional NAND memory, but with word line s and bit lines grouped in each plane and with string select transistors connecting each string to a corresponding bit line pad. As shown, each NAND string is formed with a silicon strip (for example, patterned poly layer 103) in which channels are formed to run in a horizontal direction that is parallel to the chip surface, with different NAND strings (for example, patterned poly layers 105, 107) stacked on top of each other. In the illustrated example, the cell transistors formed along each silicon strip (for example, 103c, 103d) are formed as dual gate devices by forming a word line gate structure 114, 116 and multi-layered gate dielectric structure 124, 126 to surround the silicon strip (for example, 103) with opposing gates formed around the silicon strip 103 where each cell channel is formed. Though not separately shown, it will be appreciated that each multi-layered gate dielectric structure 124, 126 for each memory cell transistor may include a tunnel dielectric layer formed to surround the channel region of the silicon strip (for example, 103, 105, 107, 113, 115, 117), a charge storage layer (for example, ONO) formed around the tunnel dielectric layer, and a coupling dielectric formed around the charge storage layer. Around each multi-layered gate dielectric structure 124, 126, a word line gate structure 114, 116 may be formed with one or more patterned polysilicon layers to extend across multiple strings. To improve the conductivity of the poly word line gate structures 114, 116, a silicide layer 114a, 116a may be formed at a contact surface, such as by forming a tungsten silicide layer. In addition, the transistors formed in each silicon strip may include implanted and/or diffused source/drain regions (for example, n+ regions) on at least the string select transistor and ground select transistor, if not also the memory cell transistors. In other embodiments, the memory cell transistors may be formed as junction-free cells with virtual sources/drain regions formed to have conductivity that depends on the existence of electric fringe fields between gates adjacent to the source/drain regions and the source/drain silicon itself.

In addition to the separate word line gate structures 114, 116 formed along the stacked cell strings 103, 105, 107, 113, 115, 117, each string also includes additional gate structures on each end of the string to define a ground and string select transistors. As shown, the ground select transistors may be formed with a poly gate structure 112 (and optional silicide layer 112a) which connects the source node of each stacked string 103, 105, 107, 113, 115, 117 to a shared or common source line 110, while string select transistors may be formed with separate poly gate structures (for example, 118), each of which connects the drain nodes of vertically stacked strings (for example, 113, 115, 117) to a corresponding bit line pad under control of a string select signal (for example, $SSL_{n+1}$).

In this way, the source node of each string is shared with adjacent strings that are located above or below it in a vertical direction via a source contact using the common source line 110, but the drain node of each string is shared only horizontally with other strings via a bit line pad but not vertically. If desired, the ground and string select transistors may be formed as dual gate devices substantially as described above. For example, the string select transistor at the drain node of each string may be formed with a poly gate structure (for example, 118, 120) and optional silicide layer (for example, 120A) formed around a multi-layered gate dielectric structure (for example, 128), while the ground select transistor at the source node of each string may be formed with a poly gate structure 112 formed around a multi-layered gate dielectric structure 124.

By forming each word line gate structure 114, 116 around the multi-layered gate dielectric structure 124, 126 to extend horizontally across separate vertical stacks of silicon strips (for example, 103/105/107 and 113/115/117), separate word line (WLi) signals may be connected to each poly gate node 114, 116 of the cell transistors in a horizontal or lateral direction. In addition, each cell transistor shares its poly gate node 114, 116 (and applied word line WLi signal) with all cell transistors that are stacked vertically above it. Bit lines can also be shared by one or more strings formed in the same layer (for example, 103/113) by connecting the strings to a shared bit line pad (for example, 104) which is used to establish electrical connection from the connected strings to the common bit line (for example, 150) through one or more via contacts or conductors 132. In similar fashion, strings formed in another layer (for example, 105/115) may be connected to a shared bit line pad (for example, 106) which is electrically connected to a second common bit line (for example, 151) through one or more via contacts or conductors 133, while strings formed in another layer (for example, 107/117) may be connected to a shared bit line pad (for example, 108) which is electrically connected to another common bit line (for example, 152) through one or more via contacts or conductors 134.

Extending across all stacked cell strings 103, 105, 107, 113, 115, 117, the poly gate structure 112 for the shared ground select transistor connects the source nodes of adjacent strings 103, 105, 107, 113, 115, 117 that are located above or below it to the common source line contact 110. In contrast, each poly gate structure 118, 120 for a given string select transistor does not extend across multiple strings in the same plane, but is instead formed as an island SSL gate (e.g., 120), so that each string (for example 103) shares a common SSL gate (for example, 120) with the vertically stacked strings (for example, 104, 107), but not any strings (for example, 113) in the same plane.

The depicted vertical gate NAND flash memory 100 illustrates selected example embodiments for a three-dimensional array architecture of a vertical gate NAND flash memory which allows individual pages to be selected for read and program operation and which may erase selected blocks in a VG NAND structure. However, it will be appreciated that a vertical gate NAND flash memory may be implemented with different features and structures. For example, the common source line contact 110 may be formed with a different shape or structure, such as a using a plate-shaped layer and/or a conductive line that runs in a horizontal direction and connects vertically to an additional metal line which runs in a horizontal direction. In addition, the arrangement and connection of stacked cell strings 103, 105, 107, 113, 115, 117 may be oriented to all run in the same direction, to run alternating strings in opposite directions, or with any desired orientation of different strings. In addition, any desired alignment, shape, and positioning of the poly gate structure (for example, 118, 120) and/or bit line pads (for example, 104, 106, 108) may be used to establish electrical connection to the metal layers 140-141, 150-152 through respective via contacts 130-134.

With three-dimensional vertical gate NAND flash memory array architectures, conventional decoding approaches for addressing individual cells (at the intersection of a one-dimensional word line and bit line) cannot be readily applied for a variety of reasons. For example, VG NAND word line nodes cannot be vertically isolated without substantial processing cost increases over the one-step photolithography process used to form word line s. In addition, vertical gate NAND flash memory array architectures typically require that bit lines be shared between NAND strings from different layers in order to reduce process complexity and save chip area, in which case the intersection of a word line and bit line is not sufficient to address an individual cell. As a result, an addressing scheme is required for vertical gate NAND flash memory array architectures having multiple cells stacked in a vertical direction which share a fin-shaped poly gate word line, having multiple strings belonging to the same vertical layer which share a single bit line through a horizontal bit line pad, and having vertically stacked strings in different vertical layers which share an island-shaped string select gate.

Figure 8:
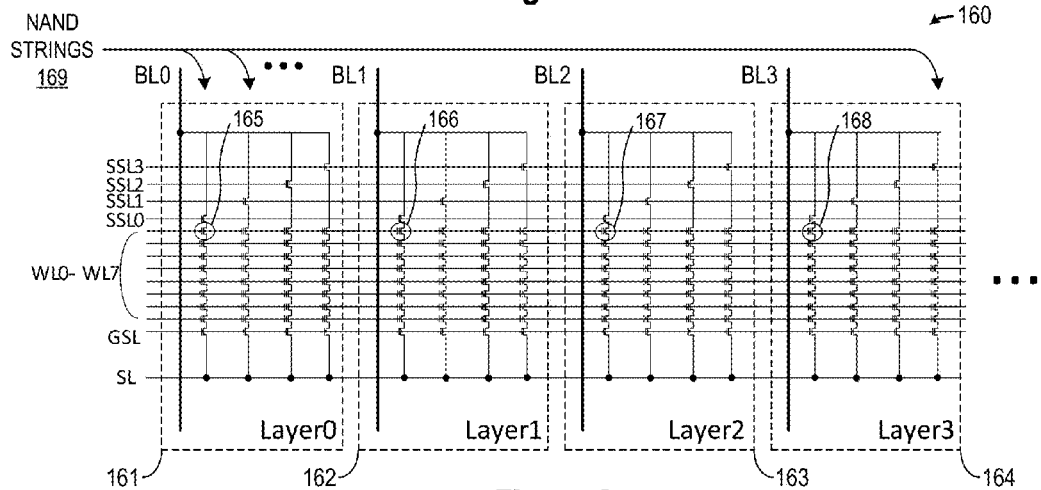
FIG. 8 is a simplified circuit schematic diagram illustrating the electrical connectivity of a vertical gate NAND flash memory array architecture with island-type string select transistors and a common source line for implementing an example block erase operation.

To illustrate such an addressing scheme, reference is now made to FIG. 8 which depicts a simplified circuit schematic diagram of the electrical connectivity (but not the geometrical structure) of a vertical gate NAND flash memory array 160 with island-type string select transistors for implementing an example block erase operation to erase all strings sharing a common set of word lines WL0-WL7. As illustrated, the array 160 includes a plurality (for example, 16) of NAND strings 169 which belong to a plurality (for example, 4) of vertically stacked layers 161-164 (for example, Layer0-Layer3), which share a common set of word lines WL0-WL7, and which are connected in parallel between different bit lines BL0, BL1, BL2, BL3 and a common or shared source line SL. Each NAND string includes 8 cells connected in a vertical gate configuration to receive word lines WL0-WL7, respectively. In addition, a single bit line (for example, BL0) is connected to the NAND strings in each layer (for example, Layer0 161). Though not shown, it will be appreciated that the array circuit 160 is repeated to the right with additional multi-layer structures being connected to the same word lines WL0-WL7. To provide for the necessary granularity of decoding for selecting single strings out of the multiple strings that share one bit line pad, island-shaped string select (SSL) gates are used to connect different NAND strings from each vertical layer to a respective bit line. With this arrangement, single cells in the NAND flash memory array 160 are selected by a combination of selected word lines, bit lines and SSL lines, and not just by selecting word lines and bit lines alone as in 2D NAND Flash which would result in the selection of multiple cells per bit line. In addition, read and programming operations are performed one page at a time such that the cells (for example, 165-168) belonging to one page are connected to the same word line (WL0) and are selected by SSL gates which are all connected to the same SSL line (SSL0). As a result, the cell array in FIG. 8 includes 32 pages specified as 8 word lines times 4 SSL lines, though the size of the cell array may be increased by adding bit lines. However, since the source line SL is a common node shared by all NAND strings in the different vertically stacked layers 161-164, there is no source line decoding and selection during read, program or erase operation. Through the shared source line, the bodies of all NAND strings in the cell block that share the same source line are positively charged by the positive erase voltage V_erase through a hole injection mechanism created by Gate Induced Drain Leakage (GIDL) at the reverse biased the n-p junctions at the string sources or drains or both during erase operations, thereby forming a single erase block for all such NAND strings.

Figure 9:
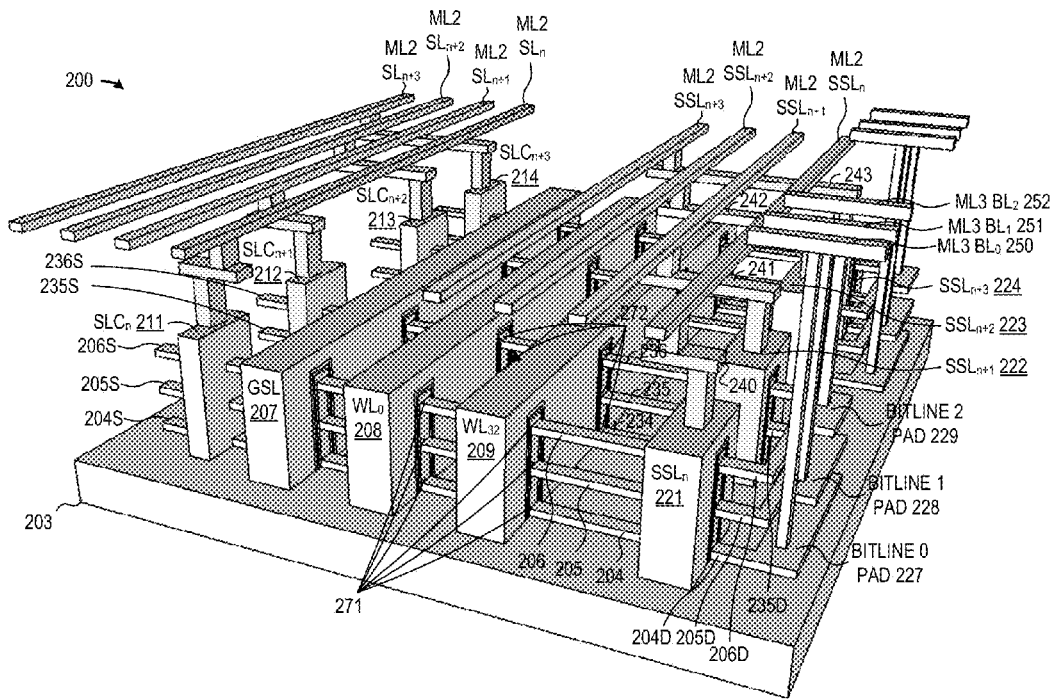
FIG. 9 illustrates a three-dimensional array architecture for a vertical gate NAND flash memory having a plurality of erase blocks arranged in a group of blocks with each erase block of NAND strings being connected between a paired source line and string select transistor in accordance with selected embodiments.

In accordance with selected embodiments disclosed herein, an improved vertical gate NAND flash memory array architecture and associated decoding scheme are provided which retain the ability to select individual strings and pages for read and program operation while effectively reducing the erase block size to improve memory performance and reduce manufacturing costs. For example, FIG. 9 illustrates a three-dimensional array architecture of a vertical gate NAND flash memory 200 having a plurality of erase blocks (e.g., 271, 272) arranged and connected to form a plurality of vertically stacked NAND strings (e.g., 204-206, 234-236) sharing a common set of word lines 208, 209, with vertical stacks of NAND strings (e.g., 204-206) being connected between a dedicated pairing of an SSL gate (e.g., 221) and a source line contact (e.g., 211). However, it will be appreciated that the depicted NAND flash memory 200 is shown in simplified form for purposes of providing a general idea of the geometric shapes and connections of individual elements without being visually cluttered by providing a rigorous and exact depiction. For example, only three layers of stacked NAND strings (e.g., 204-206) are shown, when in fact a NAND string stack will typically include $2^n$ NAND strings (n=1, 2, 3 . . . ). In addition, only two word line gates 208, 209 are shown, when in fact there will typically be $2^n$ word line gates (n=1, 2, 3, 4, 5, . . . ). Also, each erase block (e.g., 271) is illustrated with reference to the string cells in a single vertical stack of NAND strings 204-206 that are defined by two word line gate structures 208, 209 and connected between a dedicated pairing of a string select transistor gate (e.g., 221) and a source line contact (e.g., 211), though it will be appreciated that the erase block may include additional cells from other vertical NAND string stacks having additional word line gate structures, provided that the vertical NAND string stacks in the erase block are all connected to a common source line. However and as explained below, the depicted NAND flash memory 200 does correctly illustrate in general the geometric shape and connection of certain elements, including bit line pads (e.g., 227) which are only shared horizontally by adjacent strings, island-shaped SSL gates (e.g., 221) which are only shared vertically by stacked strings, SL contacts (e.g., 211) which are only shared vertically by stacked strings, and word line gates which are shared both vertically and horizontally with adjacent and stacked strings. The depicted NAND flash memory 200 also illustrates in general how the source line contacts and SSL gates are connected to respective higher level (e.g., M2) metal lines running in the word line direction, while the bit line pads are connected to respective higher level (e.g., M3) metal lines. Connected between a dedicated pairing of an SSL gate (e.g., 221) and a source line contact (e.g., 211), each erase block (for example, 271) includes a plurality of vertically stacked NAND strings (204-206) that are formed over a chip substrate 203 to extend through separate ground select transistor gate structures 207 and word line gate structures 208, 209, with each cell string running in a direction that is parallel to the surface of the chip substrate 203. Insofar as the word line gate structures 208, 209 extend across other erase blocks (e.g., 272) formed by vertical NAND gate stacks (e.g., 234-236) connected between dedicated pairings of an SSL gate (e.g., 222) and a source line contact (e.g., 212), the group of separately controllable erase blocks sharing a common set of word lines may be referred to as a "super block" which contains multiple erase blocks (e.g., 271-272).

As seen from the foregoing, the layout of the VG NAND flash memory 200 resembles the VG NAND flash memory 100, but with separately controllable erase blocks (e.g., 271, 272), each having a dedicated source line and string select transistor gate structure connected, respectively, at the source and drain ends of a vertical stack of NAND strings. For example, a first separately controllable erase block 271 includes a vertical stack of NAND strings 204-206 connected between a dedicated source line contact ($SLC_n$) 211 and string select transistor gate structure 221. The source line contact ($SLC_n$) 211 is positioned to connect the source end of the vertical stack of NAND strings 204-206 to a corresponding upper metal (e.g., M2) source line (e.g., $SL_n$) through one or more via contacts and metal line conductors. In similar fashion, the string select transistor gate structure 221 is positioned to connect the drain end of the vertical stack of NAND strings 204-206 to a corresponding upper metal (e.g., M2) string select line (e.g., $SSL_n$) through one or more via contacts and metal line conductors. The VG NAND flash memory 200 also has a second separately controllable erase block 272 which includes a vertical stack of NAND strings 234-236 connected between a dedicated source line contact ($SLC_{n+1}$) 212 and string select transistor gate structure 222 connected, respectively, at the source and drain ends of a vertical stack of NAND strings 234-236, and so on. As formed, each NAND string may be formed with a silicon strip (for example, patterned p-type poly layer 204), with different NAND strings (for example, patterned poly layers 205-206) stacked on top of each other. Along each NAND string, cell transistors may be fabricated as dual gate devices by forming a word line gate structure 208, 209 to surround multi-layered gate dielectric structures formed around each silicon strip (for example, 204), where each multi-layered gate dielectric structure may include a tunnel dielectric layer, a charge storage layer (for example, ONO), and a coupling dielectric formed. Around each multi-layered gate dielectric structure, a word line gate structure 208, 209 may be formed with one or more patterned polysilicon layers to extend across NAND strings in multiple erase blocks, and may include a silicide layer, such as tungsten silicide (not shown) to improve the conductivity of the poly word line gate structures. The cell transistors in each NAND string may also include implanted and/or diffused source/drain regions, or may be formed as junction-free cells with virtual sources/drain regions formed to have conductivity that depends on the existence of electric fringe fields between gates adjacent to the source/drain regions and the source/drain silicon itself.

As illustrated, each dedicated string select transistor gate structure (for example, $SSL_n$ 221) for each erase block (for example, 271) connects the string body portions 204-206 of the vertically stacked NAND strings to corresponding drain node portions 204D-206D of the vertically stacked NAND strings under control of a dedicated string select line (for example, $SSL_n$ 240) during read and program operations to the strings in the erase block 271. Likewise, other erase blocks (for example, 272) in the group of blocks (sharing a common set of word lines) include a dedicated string select transistor gate structure (for example, $SSL_n$ 222) for connecting the string body portions 234-236 of the vertically stacked NAND strings to corresponding drain nodes under control of a different dedicated string select line (for example, $SSL_{n+1}$ 241) during read and program operations to the strings in that erase block 272. In addition, each drain node of each NAND string 204D-206D in an erase block (e.g., 271) may also be shared horizontally with drain nodes of other strings 234-236 in another erase block (e.g., 272) via shared bit line pads 227-229, but is not shared vertically with other NAND string drain nodes in the erase block. In selected embodiments, the string select transistor gates 221-224 may define non-volatile flash memory cells by including a multi-layered gate dielectric structure around each NAND string which includes a tunnel dielectric layer, a charge storage layer (for example, ONO), and a coupling dielectric.

The illustrated vertical gate NAND flash memory 200 also includes ground select transistors on a source end of each NAND string by forming a ground select transistor gate structure 207 which extends across multiple erase blocks 271-272 to surround gate dielectric structures formed around each NAND string. In selected embodiments, the ground select transistors are formed as non-volatile flash memory cells by including a multi-layered gate dielectric structure around each NAND string which includes a tunnel dielectric layer, a charge storage layer (for example, ONO), and a coupling dielectric. For each erase block (for example, 271), the ground select transistor gate structure 207 may be used to connect the string body portions 204-206 of the vertically stacked NAND strings to corresponding source node portions 204S-206S of the vertically stacked NAND strings, each of which is electrically connected directly to a dedicated source line contact (for example, $SLC_n$ 211) and corresponding source line (for example, $SL_n$) for that erase block. In this way, the source node of each NAND string in an erase block (for example, 271) is shared with vertically stacked strings in the erase block located above or below it in a vertical direction via a dedicated source line contact (for example, 211) that is physically and electrically separate from other source lines (for example, 212, 213, 214). In similar fashion, other erase blocks (for example, 272) in the group of blocks (sharing a common set of word lines) use the ground select transistor gate structure 207 to connect the string body portions 234-236 of the vertically stacked NAND strings to corresponding source node portions 235S, 236S of its stacked NAND strings, each of which is electrically connected directly to a dedicated source line contact (for example, $SLC_{n+1}$ 212) and corresponding source line (for example, $SL_{n+1}$) for that erase block. The provision of separate dedicated source lines SLi for each erase block allows each erase block 271-272 to be separately erased by providing an erase voltage V_erase and string select signal to the source line and string select gate, respectively, for the selected erase block. Alternatively, all erase blocks can be erased together by providing the erase voltage V_erase and string select signals to all source lines and string select gates, respectively.

By forming each word line gate structure 208-209 with multi-layered gate dielectric structures to extend horizontally across stacked NAND strings of multiple erase blocks (for example, 271-272), separate word line (WLi) signals may be connected to each word line gate node 208, 209 of the cell transistors in a horizontal or lateral direction. In addition, each cell transistor shares its word line gate node 208, 209 (and applied word line WLi signal) with all cell transistors that are stacked vertically above it. Bit lines can also be shared by one or more strings formed in the same layer (for example, 205, 235) by connecting the NAND string drain nodes 205D, 235D to a shared bit line pad (for example, 228) which is used to establish electrical connection from the connected strings to the common bit line (for example, 251) through one or more via contacts or conductors. In similar fashion, strings formed in another layer (for example, 204, 234) may be connected to a shared bit line pad (for example, 227) which is electrically connected to a second common bit line (for example, 250) through one or more via contacts or conductors, while strings formed in another layer (for example, 206, 236) may be connected to a shared bit line pad (for example, 229) which is electrically connected to another common bit line (for example, 252) through one or more via contacts or conductors.

Extending across stacked NAND strings of multiple erase blocks (for example, 271-272), the ground select transistor gate structure 207 connects the source nodes of NAND strings in each erase block 271-272 to a corresponding dedicated source line contact 211-212. In contrast, each source line contact structure (for example, $SLC_n$, 211) for a given erase block (for example, 271) does not extend across NAND strings in other erase blocks (for example, 272), but is instead formed as a physically separate, dedicated source line contact structure that may be used to selectively erase the stacked NAND strings (for example 204-206) for a given erase block (for example, 271). In addition, each string select transistor gate structure (for example, $SSL_n$, 221) for a given erase block (for example, 271) does not extend across NAND strings in other erase blocks (for example, 272), but is instead formed as an island SSL gate (e.g., 221) for selecting individual NAND strings (for example 204-206) in a given erase block (for example, 271) for read or program operations. By providing separate string select transistor gate structures 221-224 and source line contacts 211-214 for each erase block, the NAND strings between a paired source line contact (e.g., 211) and string select transistor (e.g., 221) can be separately erased by supplying an erase voltage V-erase to a selected source line contact (for example, 211), thereby charging the connected NAND string bodies (e.g., 204-206) to erase the memory cells in that erase block of connected NAND strings.

Figure 10:
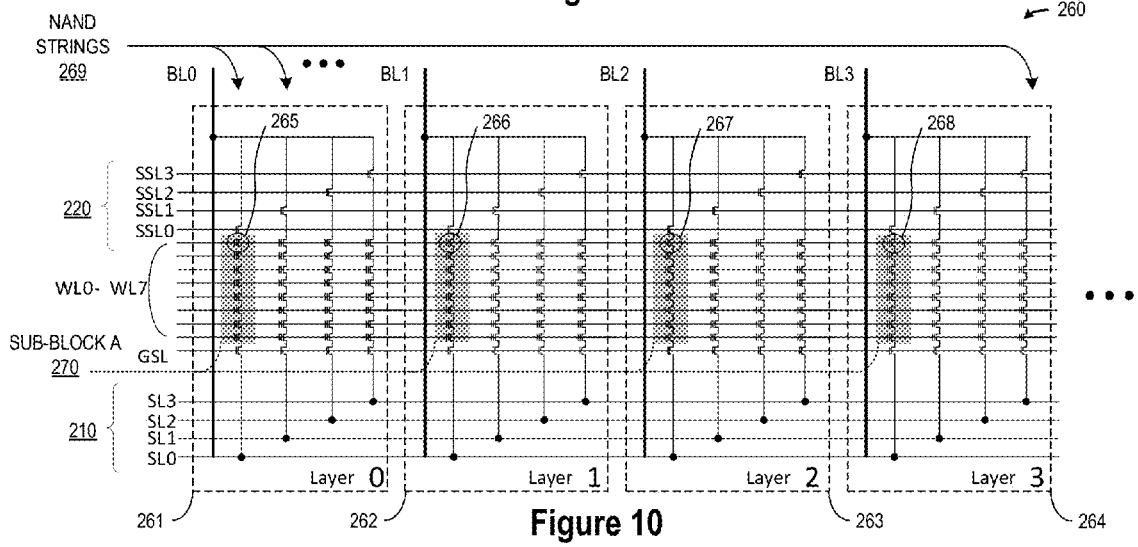
FIG. 10 is a simplified circuit schematic diagram illustrating the electrical connectivity of a vertical gate NAND flash memory cell array in accordance with selected embodiments.

To illustrate an addressing scheme for selectively erasing memory cell sub-blocks in a vertical gate NAND flash memory array of cells sharing a common set of word lines, reference is now made to FIG. 10 which depicts a simplified circuit schematic diagram of the electrical connectivity (but not the geometrical structure) of a vertical gate NAND flash memory array 260 which uses dedicated pairs of source lines and string select transistors for implementing sub-block erase operations in accordance with selected embodiments of the present disclosure. As illustrated, the array 260 includes a plurality (for example, 16) of NAND strings 269 which belong to a plurality (for example, 4) of vertically stacked layers 261-264 (for example, Layer0-Layer3), which share a common set of word lines WL0-WL7, and which are connected in parallel between a different bit line BL0, BL1, BL2, BL3 for each layer and a corresponding plurality of source lines SL0, SL1, SL2, SL3 for each layer. Each NAND string includes 8 cells connected in a vertical gate configuration to receive word lines WL0-WL7, respectively. In this way, multiple cells stacked in a vertical direction may share the same fin-shaped word line and poly select gate, and multiple strings belonging to the same vertical layer share a single bit line through a horizontal bit line pad. In addition, each NAND string in each layer (for example, Layer0 261) is connected between a given bit line (for example, BL0) and a different source line (for example, SL0, SL1, SL2, SL3) using a different string select line transistor (for example, SSL0, SSL1, SSL2, SSL3) that is paired with each different source line. Though not shown, it will be appreciated that the array circuit 260 is repeated to the right with additional multi-layer structures being connected to the same word lines WL0-WL7, but to different bit lines. To provide for the necessary granularity of decoding for selecting a single string from the multiple strings that are connected to the same bit line, island-shaped SSL gates 220 are used to connect different NAND strings from each vertical layer to a respective bit line. Like the word lines WL0-WL7, the SSL gates 220 are shared by multiple strings in a vertical direction, but are not shared among adjacent strings in the horizontal direction (contrary to word lines).

In the illustrated VG NAND flash memory array 260, sixteen NAND strings of 8 cells each belonging to four vertical layers 261-264 are connected to four different bit lines BL0, BL1, BL2, BL3 as shown. The different layers Layer0-Layer3 are to be understood to be stacked on top of each other in a direction vertical to the chip surface, and not as being laid out side-by-side as drawn in the schematic. With this arrangement, single cells in the NAND flash memory array 260 are selected by a combination of selected word lines, bit lines and SSL lines. In addition, read and programming operations are performed one page at a time such that the cells (for example, 265-268) belonging to one page are connected to the same word line (WL0) and are selected by SSL gates which are all connected to the same SSL line (SSL0). As a result, the cell array in FIG. 10 includes 32 pages specified as 8 word lines times 4 SSL lines, though the size of the cell array may be increased by adding bit lines. However, since dedicated source lines SL0, SL1, SL2, SL3 are paired with corresponding SSL lines SSL0, SSL1, SSL2, SSL3 in each layer 261-264, each NAND string coupled between a dedicated source line/SSL line pair may be separately erased by charging the coupled NAND string bodies with the positive erase voltage V_erase through the corresponding source line during erase operations. Thus, the disclosed vertical gate NAND flash memory array 260 includes multiple, separately controlled source lines 210, each of which is connected across a plurality of vertically stacked VG NAND strings to a corresponding or paired SSL line, thereby forming a defined erase sub-block. For example, a first erase sub-block 270 includes all VG NAND strings that are connected between SSL0 and SL0 (indicated in gray), a second erases sub-block includes all VG NAND strings that are connected between SSL1 and SL1, and so on.

Although there are a variety of possible embodiments in which the number of source lines may be different or the strings to which they connect may different, the way in which the source lines connect to strings is not arbitrary. For example, all VG NAND strings which are connected to a specified SSL line are either identical to the VG NAND strings which are connected to a corresponding specified source line, or form a subset of all strings connected to the corresponding specified source line. In other embodiments, all VG NAND strings which are connected to a specified SSL line are connected to exactly one source line. Stated another way, among the VG NAND strings which are connected to a specified SSL line, there may not be some strings which are connected to a first source line and other strings which are connected to a different second source line.

Figure 11:
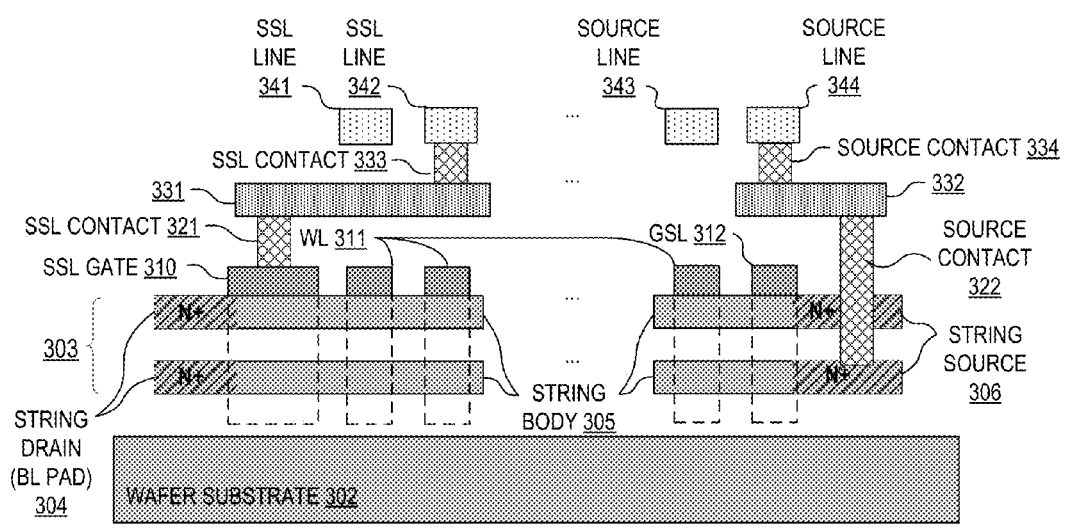
FIG. 11 illustrates a partial cross-sectional view of a vertical gate NAND flash memory structure in accordance with selected embodiments.
Figure 12:
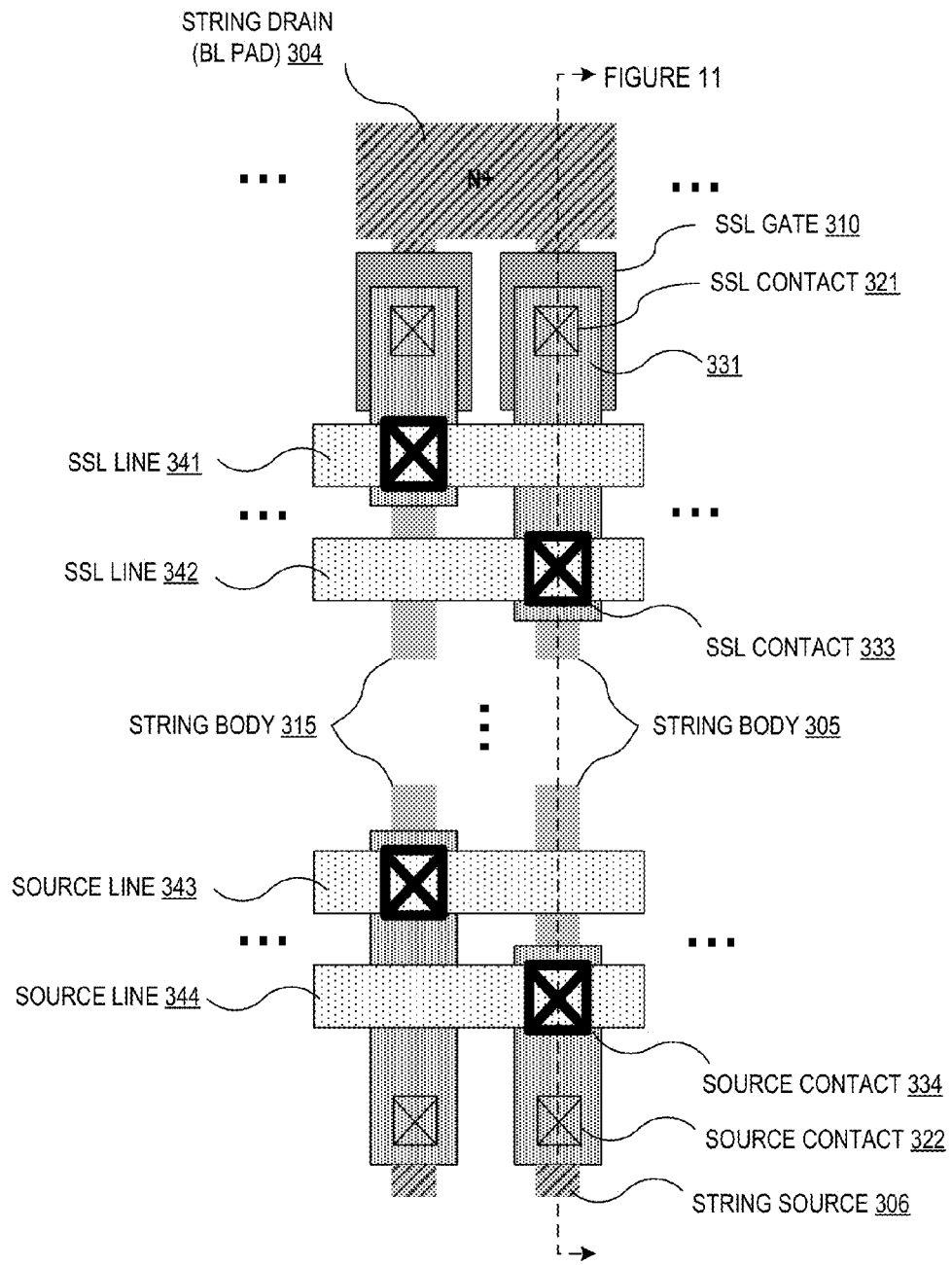
FIG. 12 illustrates a partial plan view of the vertical gate NAND flash memory structure shown in FIG. 11.

As will be appreciated, a variety of different cell technologies may be used for the VG NAND strings so that they may be formed with or without floating string bodies. In selected cell technology embodiments, the stacked cell strings each have floating bodies which are enclosed on the drain as well as the source side by a diffusion layer of opposite conductivity type from the body region. For example, FIGS. 11-12 illustrate cross-sectional and plan views of an example floating body embodiment of a VG NAND flash memory array erase block formed with a plurality of stacked NAND strings, where the bodies of each cell string are formed with a first conductivity type material (for example, p-type polysilicon) having drain and the source ends formed with a second, opposite conductivity type material (for example, n-type polysilicon) that are connected respectively to bit lines and source lines. In these cases, the string bodies are erased by being positively charged through a hole injection mechanism created by Gate Induced Drain Leakage (GIDL) at the reverse biased n-p junctions at the string sources or drains or both.

Referring first to FIG. 11, there is shown a partial cross-sectional view 300 of a vertical gate NAND flash memory erase block structure in accordance with selected embodiments wherein selected conductive elements are shown without separately illustrating the surrounding insulating layers, such as dielectric layers, interlayer dielectrics, etc. The same vertical gate NAND flash memory erase block structure is shown in FIG. 12 with the plan view 301, where the cross-sectional view of FIG. 11 is a vertical cross section along the "FIG. 11" cutline shown in FIG. 12. As illustrated, the vertical gate NAND flash memory erase block structure includes a plurality of vertically stacked NAND strings 303 formed between a chip substrate 302 and a plurality of upper layer string select transistor (SSL) lines 341-342 and source lines 343-344. As formed, the stacked NAND strings 303 in the erase block structure extend through separate ground select transistor gate structures 312 and word line gate structures 311, with each cell string 303 running in a direction that is parallel to the surface of the chip substrate 302. The depicted erase block structure shows only two vertically stacked strings 303, but any number of stacked string layers may be used. As described herein, the ground select transistor gate structures 312 and word line gate structures 311 may also extend across one or more additional erase block structures.

In selected embodiments where each cell string 303 in the erase block structure includes a floating string body 305 formed with a first conductivity type material (for example, p-type polysilicon), the drain ends 304 of each string 303 may be formed with a second, opposite conductivity type material (for example, N+ polysilicon). On the drain end of each string in a vertical stack of strings, the island SSL gate 310 is connected through contacts 321, 333 and local interconnects 331 to a corresponding SSL metal line 342 for vertical stack of strings forming the erase block structure. However, as shown in the plan view 301 of FIG. 12, the island SSL gate 310 is shared vertically among different strings 303 which are stacked on top of each other, but not by neighboring strings 315 in the horizontal direction.

In such floating string body embodiments, each cell string 303 also includes a string source end 306 formed with a second, opposite conductivity type material (for example, N+ polysilicon) which is connected through contacts 322, 334 and local interconnects 332 to a single dedicated metal source line 344 for the erase block structure. With this arrangement, the SSL gate 310, WL gates 311, and GSL gate 312 are positioned to wrap around the vertically stacked strings 303 while being isolated from the string bodies 305 by one or more dielectric layers (not shown), but the source contacts 322 are electrically connected to the vertically stacked strings 303 at the string source portions 306. However, as shown in the plan view 301 of FIG. 12, the string sources 306 are connected for strings 305 that are stacked vertically, but not for neighboring strings 315 in the horizontal direction. In operation, the erase block structure is erased when the string sources 306 are biased at the erase voltage V_erase through the source lines 344, thereby charging the string bodies 305 by hole injection induced by GIDL current. However, in other non-floating body embodiments, the string bodies may be connected at the source side to a diffusion layer of the same conductivity type as the string body, or otherwise directly connected to the source line contact so that the source line is connected to the string body (not shown).

Figure 13:
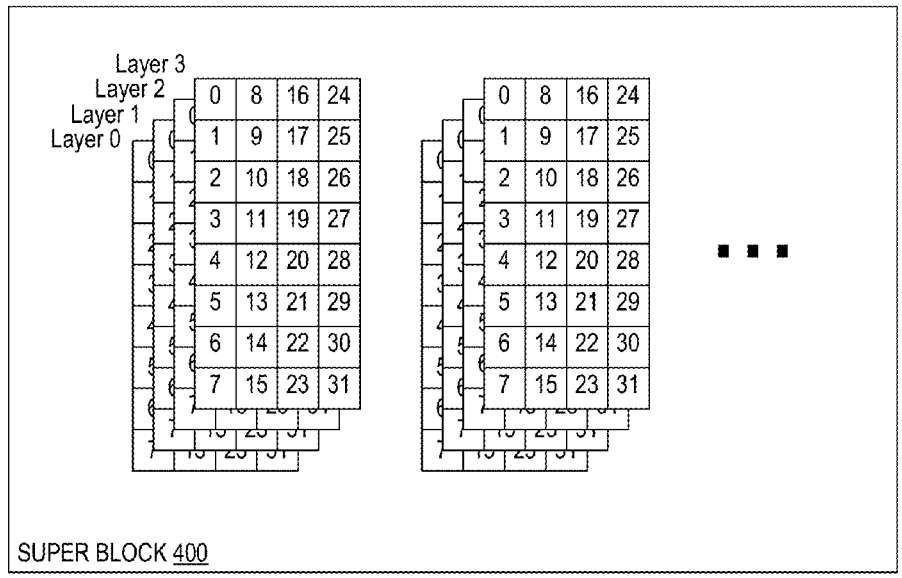
FIG. 13 illustrates a simplified block diagram of a page structure for a vertical gate NAND flash memory cell array in accordance with selected embodiments.

To illustrate a page structure which may be used for addressing the vertical gate NAND flash array 260 shown in FIG. 10, reference is now made to FIG. 13 which shows a simplified block diagram of a group of blocks sharing a common set of word lines (alternatively herein referred to as "super block") for a flash array extended to 8 bit lines with multiple NAND string layers (for example, Layers 0-3) stacked vertically on top of each other so that cells which are located in a vertical direction to each other and are selected by the same SSL gate belong to the same page. As different pages are selected by selecting different SSL gates via different SSL lines, a block decoder (not shown) is used to select a single SSL line (out of the plurality of SSL lines) and a corresponding source line (out of the plurality of source lines) to define individual erase blocks with in the super block 400. For example, strings which contain pages 0-7 are all connected to SSL0 and SL0 to form a first erase block structure, while strings which contain pages 8-15 are all connected to SSL1 and SL1 to form a second erase block structure, and so on. As a result, all pages in the super block 400 do not belong to the same erase block as they are not all commonly erased in one erase operation. However, since all shown strings share the same set of word lines, the entirety of the cells in FIG. 13 sharing a common set of word lines is referred to as a cell super block 401 which contains a plurality of separately controllable erase blocks, each of which includes a plurality of strings which are connected to the same source line. For example, strings containing pages 0-7 which are connected to SL0 constitute one erase block. Strings containing pages 8-15 which are connected to SL1 constitute a different erase block, and so on.

Figure 14:
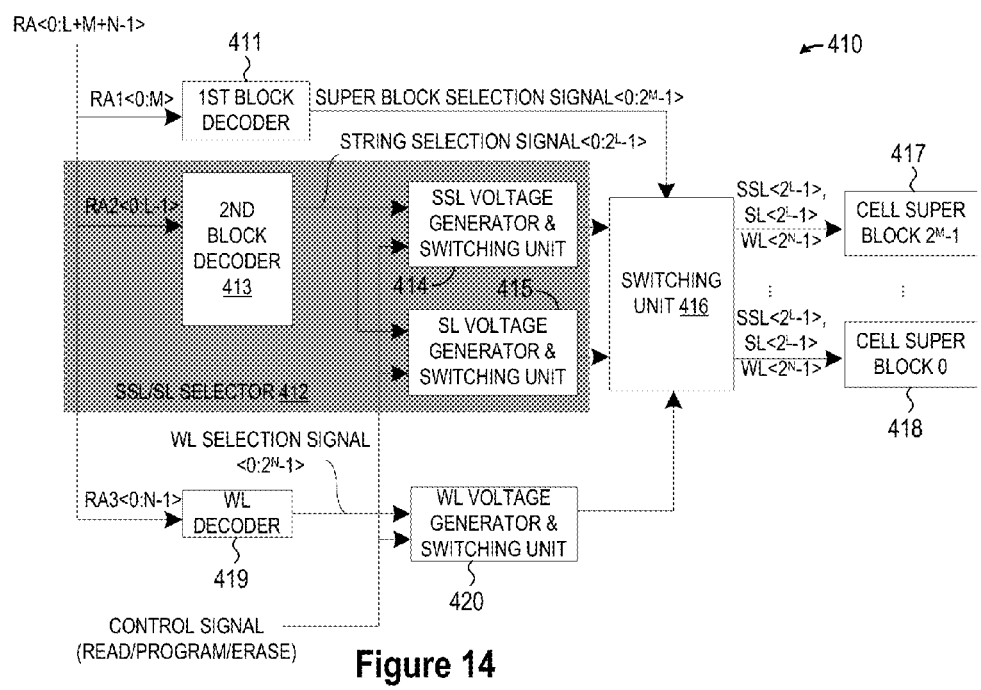
FIG. 14 illustrates a conceptual block diagram of row decoding circuitry for a vertical gate NAND flash memory cell array in accordance with selected embodiments.

As explained above, block decoder is used to select paired SSL and SL lines to define individual erase blocks, as shown in FIG. 14 which illustrates a conceptual block diagram of row decoding circuitry 410 for a vertical gate NAND flash memory cell array. As illustrated, the row decoder circuit 410 selects pages for read and program operation, but also includes an SSL/SL decoding block 412 which selects individual erase blocks from the cell super block for erase operations. In operation, the row decoder circuit 410 receives a row address RA<0:L+M+N−1> which contains address bits for decoding blocks and address bits for decoding pages. A first block decoder 411 decodes M bits from the row address to generate $2^M$ output signals which are provided to a switching unit 416 to serve as selection signals for individual cell super blocks. In addition, a word line (WL) decoder 419 decodes N bits of the row address to generate $2^N$ output signals which serve as WL selection signals that connect individual global word lines to the appropriate word line voltages at the WL switching unit 420 which may include a WL voltage generator which receives control signals indicating read, program or erase operation, and generates in response appropriate voltages for output to the switching unit 416.

In addition to the first block decoder 411, the row decoding circuitry 410 includes an SSL/SL decoding block 412 which receives and processes L row address bits to select an SSL line from the plurality of SSL lines, and to select an individual island SSL gate within each cell super block. In an example embodiment, a second block decoder 413 decodes L bits from the row address to generate $2^L$ output signals which serve as string selection signals (SSL) that connect individual global SSL lines to the appropriate SSL voltage via a SSL switching unit and selection circuit 414 which may include a SSL voltage generator for generating the appropriate SSL voltage. In this way, the SSL voltage generator and switching unit 414 selects one individual SSL line out of multiple (for example, $2^L$) SSL lines within a selected cell super block during read and program operation. At the SSL/SL decoding block 412, the L row address bits also serve as source line addresses when decoded by the second block decoder 413 as one of $2^L$ output signals which serve as source line (SL) selection signals that connect individual global source lines to the appropriate SL voltage via an SL switching unit and selection circuit 415 which may include an SL voltage generator for generating the appropriate SL voltage. In this way, the SL voltage generator and switching unit 415 selects one individual SL line out of multiple (for example, $2^L$) SL lines within each cell super block. As seen from the foregoing, the SSL/SL decoding block 412 combines the decoding and selection circuits for the SL and SSL to control the pairing and selection of erase blocks.

Figure 15:
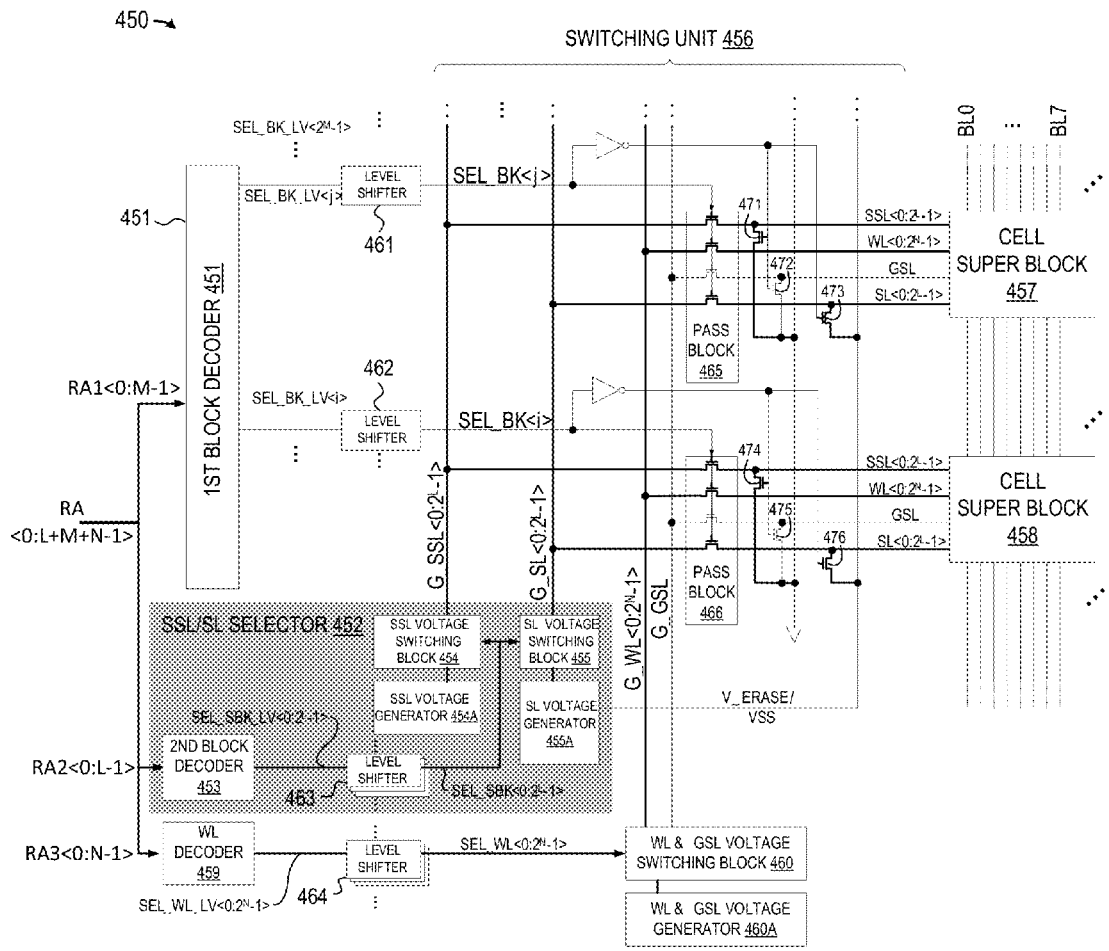
FIG. 15 illustrates a simplified circuit block diagram of row decoding circuitry for a vertical gate NAND flash memory cell array in accordance with selected embodiments.

Turning now to FIG. 15, additional details are illustrated with the circuit block diagram of row decoding circuitry 450 for a vertical gate NAND flash memory cell array in accordance with selected embodiments. As depicted, the row decoding circuitry 450 includes a first block decoder 451, a second block decoder 453, and a word line decoder 459. Each of the decoders 451, 453, 459 receives and processes selected bits from a row address RA<0:L+M+N-1> to generate a corresponding output selection signal, including a super block selection signal SEL_BK_LV from the first block decoder 451, a string selection signal SEL_SBK_LV from the second block decoder 453, and WL selection signal SEL_WL_LV from the word line decoder 459. The low voltage decoder outputs SEL_BK_LV, SEL_SBK_LV, SEL_WL_LV are boosted to high voltage (for example, 20 V) by high voltage level shifters 461-464. For example, the WL decoder 459 and associated level shifters 464 outputs as many high voltage signals SEL_WL<0:$2^N$-1> as there are word lines in each super block. These WL selection signals are applied to the WL and GSL voltage switching circuitry 460 which connects the correct voltages from a voltage generator 460A to the global word lines G_WL<0:$2^N$-1> during read, write or erase operation via a switching unit 456. In addition, the low voltage decoder outputs from the first block address decoder 451 are amplified by the high voltage level shifters 461-462 to generate as many high voltage super block selection signals SEL_BK<0:$2^M$-1> as there are cell super blocks. The super block selection signals SEL_BK are supplied to the high voltage switching unit 456 which selects one pass block 465, 466 having pass transistors for connecting the global WL, SSL and GSL lines to the local WL, SSL and GSL lines of one selected cell super block. As described herein, the cell super blocks each include multiple cell erase blocks which can be separately erased.

During erase operation, all global word lines G_WL<0:$2^N$-1> are held at ground level by the WL and GSL voltage switching circuitry 460. These ground voltages are passed to the local word lines of selected cell super blocks (for example, 457) via a pass block (for example, 465) selected by a super block selection signal (for example, SEL_BK<k>), while the word lines of unselected super blocks (for example, 458) are floated by turning OFF the pass transistors of the corresponding pass block (for example, 466). In the high voltage switching circuitry 456, each individual SSL line and each individual GSL line is connected to a discharge transistor 471-472, 474-475 whose source is connected to ground. SSL and GSL lines belonging to unselected cell super blocks (for example, 458) are discharged through these discharge transistors (for example, 474-475) which are turned ON by an inverted super block selection signal (for example, SEL_BK<i>). In other embodiments, this discharge function is used only for the SSL lines but not the GSL lines. The discharge control signal can be an inverted SEL_BK signal (as shown in FIG. 15) or an inverted low voltage SEL_BK_LV signal.

The second block address decoder 453 and high voltage level shifters 463 output as many high voltage string selection signals SEL_SBK<0:$2^L$-1> as there are SSL lines in each super block. The string selection signals SEL_SBK are supplied to the SSL voltage switching circuitry 454 which connects the correct voltages from a SSL voltage generator 454A to the global SSL lines G_SSL during read, write, or erase operation via a high voltage switching unit 456. The string selection signals SEL_SBK from the second block decoder 453 also serve as source line (SL) selection signals that are supplied to the SL voltage switching circuitry 455 which connects individual global source lines to the appropriate SL voltage via a SL switching unit and selection circuit 456 for selecting one individual SL line out of multiple ($2^L$) SL lines within each super block. Similar to the SSL lines, each individual source line is connected to a charge/discharge transistor 473, 476 which is switched by an inverted super block selection signal SEL_BK. In such embodiments, the charge/discharge transistors 473, 476 of the source lines are not connected to a permanent ground node as for the SSL and GSL lines, but are instead connected to the source line voltage generator 455A, which can either pass the erase voltage V_erase or the ground voltage Vss to source lines of unselected super blocks.

During a read operation, the row decoding circuitry 450 is operative to read all bit lines in parallel by reading currents flow from the bit lines to the source lines through all strings intended to be read, but not through any other strings. To this end, any cell current through strings of unselected super blocks can be prevented by holding the SSL lines of unselected super blocks at ground level. In addition, any cell current through unselected strings within a selected super block may be prevented by biasing all SSL lines at ground (Vss) except for the one selected SSL out of all $2^L$ SSL lines, using the second block decoder 453 and the SSL switching unit 454.

As for program operations, unselected super blocks are protected from unintentional writing of cells by preventing the programming voltage from being passed from the global to local word lines through the pass units 465, 466. Similar to the read operation, unintentional programming of unselected strings within selected super blocks can be prevented by biasing all SSL lines at Vss, except for the one selected SSL out of the $2^L$ SSL lines, by using the second block decoder 453 and the SSL switching unit 454. In this way, unselected pages within selected super blocks are protected from unintentional writing because string channels of unselected strings are floated by cutting of the strings from the bit line nodes through the turned of SSL gates.

To provide additional information about the operation of the vertical gate NAND flash memory device and associated row decoding circuitry disclosed herein, there will now be described a set of erase bias conditions that may be used during erase operations to selectively erase individual erase blocks within a cell super block. Generally speaking, the erase bias conditions are used to charge the body nodes of the stacked NAND strings with a high positive erase voltage V_erase (for example, 18 V), though the exact erase bias conditions will depend on a variety of factors, such as the cell technology, memory architecture, etc. For example, in selected floating string body embodiments, the string body nodes may be of p-type conductivity whereas the drain nodes at the bit line pads and the source nodes at the source lines may be of n-type conductivity, so that the string bodies are enclosed at both ends by regions of opposite conductivity type. In these cases the string bodies during erase operation are charged by hole injection at reverse-biased n-p junction using GIDL current. However, in other cell structures where the strings are not floating nodes enclosed by junctions, the string bodies may be directly charged using the source line such that the source node of the strings and the body node are shorted at the string source region. In either case, the erase voltage V_erase is transmitted to the string bodies from a selected source line.

To illustrate the erase operation in accordance with selected embodiments in which row decoding circuitry 450 shown in FIG. 15 is used with a floating body cell architecture to charge the floating string bodies with GIDL current during erase operation, Table 1 (set forth below) includes an example set of erase bias conditions for erasing a selected super block, while Table 2 (set forth below) includes an example set of erase bias conditions for an unselected super block:

TABLE 1

Bias condition during erase operation for a selected super block

| | |
|---|---|
| SL0 | V_erase |
| SL1-SL3 | 0 V |
| SSL0-SSL3 | V_pass |
| GSL | 0 V |
| BL0-BL3 | Floating |
| WL0-WL7 | 0 V |

TABLE 2

Bias condition during erase operation for an unselected super block

| | |
|---|---|
| SL0-SL3 | V_erase |
| SSL0-SSL3 | 0 V |
| GSL | 0 V |
| BL0-BL3 | Floating |
| WL0-WL7 | Floating |

In these example tables, it is assumed that only the strings of a selected super block (for example, 457) which are connected to SL0 are intended to be erased, and that the strings connected to SL1-SL3 are not to be erased. As depicted in Table 1, the word lines of the selected super block are biased at 0 V to ensure the voltage difference to the positively biased string bodies by which the erasure of the cell is achieved. But as depicted in Table 2, the word lines of the unselected super blocks (for example, 458) are floated to prevent erasure by boosting the word line. Another aspect shown in Tables 1 and 2 is that not all source lines are biased at the erase voltage V_erase. Instead, only the one source line (for example, SL0) out of a plurality of source lines at the selected super blocks is connected to the strings intended to be erased is biased at V_erase, while all other source lines within the selected super block (for example, SL1-SL3) are held at 0 V and do not contribute to charging up the string bodies to which they are connected. However, Table 2 shows that the source lines (for example, SL0-SL3) of unselected super blocks are all charged at the erase voltage V_erase.

In both Tables 1 and 2, the bit lines are left floating during erase operation, but will be charged through the string bodies and the forward biased n-p junction at the string drains to a voltage close to the erase voltage. In Table 1, it is seen that the SSL lines of selected super block are held at a high pass voltage Vpass that is close to the erase voltage V_erase. All GSL lines of selected and unselected super blocks alike are held at 0 V or a voltage sufficiently lower than the erase voltage V_erase to create conditions for GIDL current at the string sources.

In the selected super block (for example, 457), the only strings that are erased are those connected to the source line SL0. As a result, it can be seen that the strings connected to each different source line constitute a separate erase block. In the selected super block, the high erase bias at SL0 in combination with the ground voltage or 0V at GSL create conditions for GIDL current at the sources of the strings to which SL0 is connected, thereby charging the body nodes of these strings with a positive erase bias. Since the other source lines SL1-SL3 are biased at ground or 0V, no GIDL current occurs at these strings, and therefore the string bodies of the strings connected to SL1-SL3 are not charged. Although the bit lines are charged with positive voltage and the drain nodes of strings connected to SL1-SL3 are also positively charged as a result, this does not lead to a significant flow of current from the bit line nodes to the bodies of these strings, and consequently the string bodies are not positively biased because the SSL gates are not turned OFF, but are instead held at a high pass voltage Vpass such that GIDL current is suppressed. Any leakage current that still may occur at the string drains does not lead to positively charged string bodies because the string bodies are held close to ground level by the source lines SL1-SL3, and any positive charge in the string bodies would discharge through the forward biased junction between string bodies and source lines SL1-SL3.

In the unselected super blocks (for example, 458), all source lines are biased at the erase voltage V_erase to positively charge the string bodies. However, cell erasure is prevented by floating the word lines. In addition, all SSL lines of the unselected super blocks are held at ground level as they are discharged through the discharge transistors.

In other embodiments, the source line decoding scheme may be modified in a way that the source lines of unselected super blocks are not biased with the erase voltage, but are held at ground level since the blocks in the unselected super blocks are not to be erased anyway. In such embodiments, the bit lines are only charged through the string bodies selected for erasure, and charge is not allowed to flow back from bit lines to string bodies of unselected super blocks. This may be achieved by biasing the SSL lines to suppress GIDL current (for example, by floating all SSL lines during erase operation), or by tuning the junction at the SSL gates to prevent the GIDL conditions from occurring.

As disclosed herein, stacked memory architecture and decoding scheme disclosed herein provide reduced block size erase operations to reduce write amplification and improve performance of the vertical gate NAND flash memory as compared to conventional flash memory designs. For example, where a conventional vertical gate NAND flash memory has a block size-to-page size ratio of 32:1 with a string size of 8 cells, selected embodiments of the present disclosure provide a block size-to-page size ratio of 8:1 with the same string size, thereby improving the write amplification by reducing the movement of user data and increasing the life of reliable write operations. To illustrate the improved performance, reference is now made to FIGS. 16 and 17 which illustrate, respectively, an example write operation with a conventional page/block organization having a block size-to-page size ratio of 32:1 (FIG. 16) and an example write operation with a page/block organization having a block size-to-page size ratio of 8:1 (FIG. 17).

Figure 16:
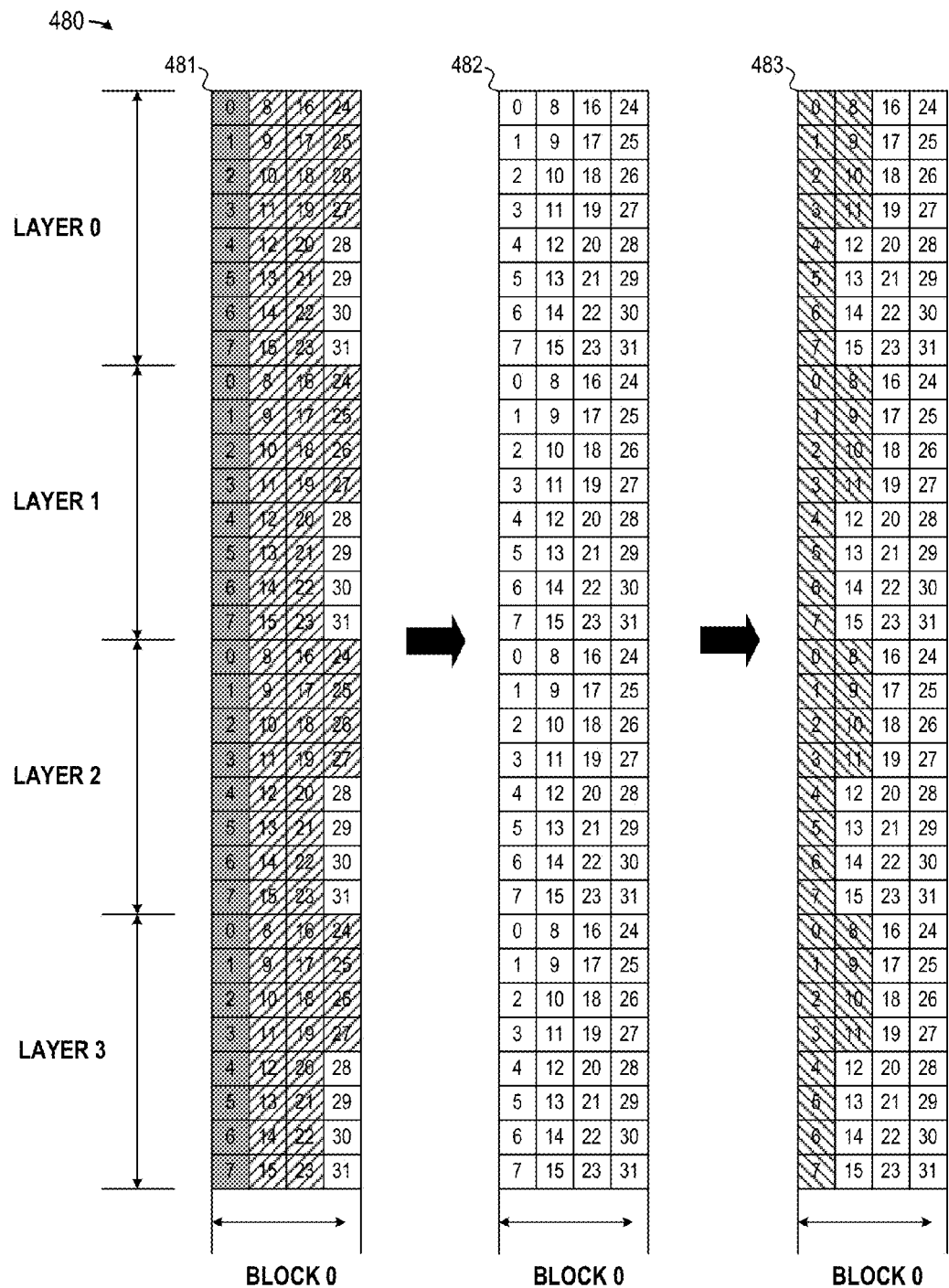
FIG. 16 illustrates a write operation using an example block and page addressing scheme to write data to the vertical gate NAND flash memory cell array.

In particular, FIG. 16 sequentially illustrates the status of a write operation 480 using a conventional block and page addressing scheme to write data to a large erase block (Block 0) in a vertical gate NAND flash memory cell array. In the depicted page/block structure, a group of pages (pages 0-31) in each layer (Layer0-3) are grouped together in a single erase block which is used to clear space for writing new data to the block. In the initial state 481 of the illustrated sequence, the block (Block 0) is partially filled with invalid data that must be removed to free up space so that new data may be written to the block. In particular, the Block 0 is partially filled with stale, invalid data (indicated with grey shaded boxes) and valid data (indicated with boxes having left-to-right diagonal cross-hatch shading), and partially unprogrammed data (indicated with white boxes). To erase the stale data from the erase block (Block 0), the old valid data (cross-hatch shading) from the initial state is first written to a different location (not shown), and then the entire block (Block 0) is erased, as shown in the second state 482. In the final state 483, the free space from the second state 482 in the block (Block 0) is written with new data (indicated with boxes having right-to-left diagonal cross-hatch shading). As seen from the foregoing, the writing of new data from the user's perspective actually includes some hidden write operations to duplicate valid data at a different location (out of place write), and the related erase operation needs to be applied to invalid as well as valid data because of the relatively large size of the erase block (Block 0).

Figure 17:
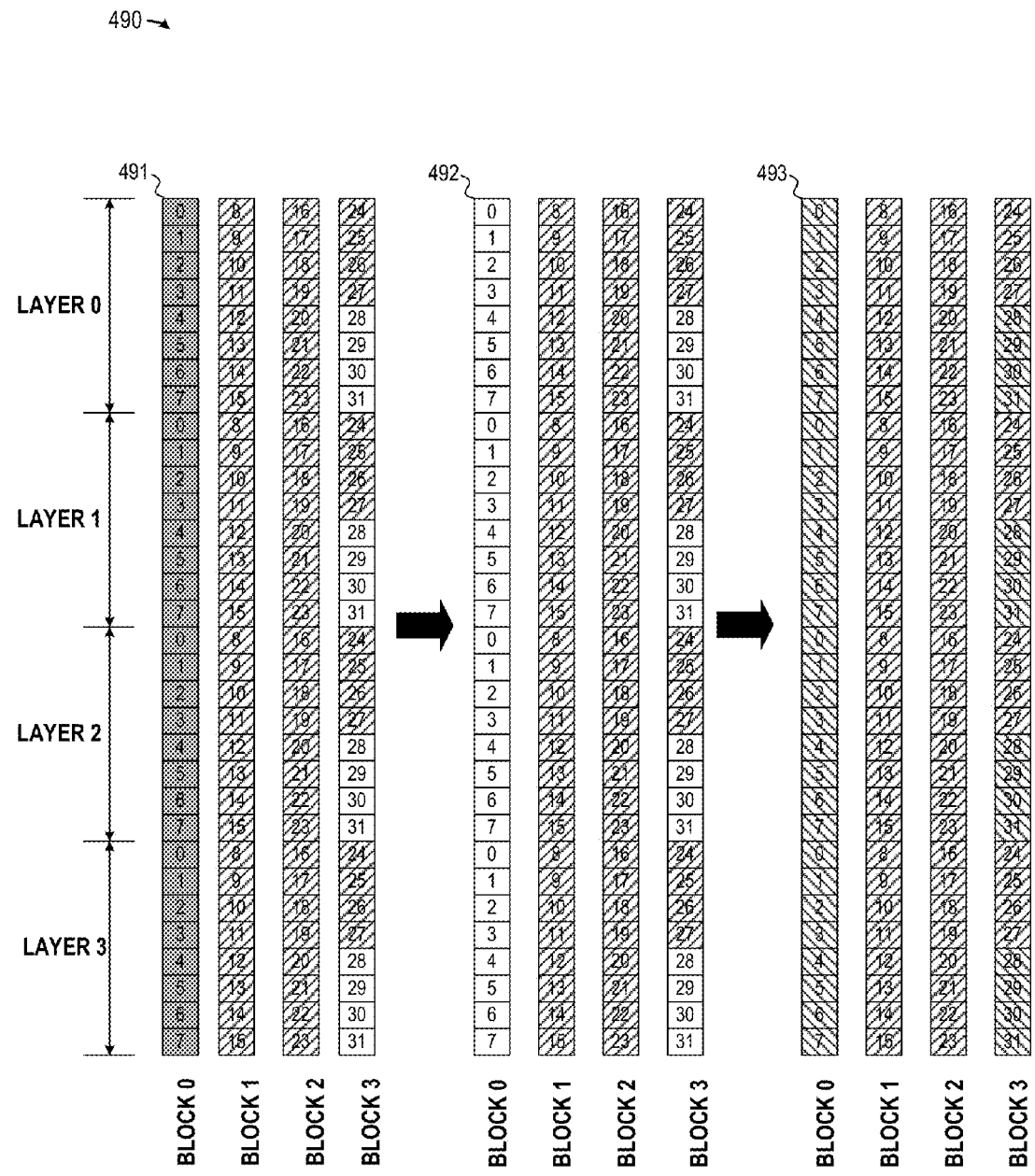
FIG. 17 illustrates a write operation using a block and page addressing scheme to write data to the vertical gate NAND flash memory cell array in accordance with selected embodiments.

In contrast, FIG. 17 illustrates a write operation 490 using a block and page addressing scheme to write data to the vertical gate NAND flash memory cell array in accordance with selected embodiments where the page/block structure divides the pages into a plurality of smaller erase blocks. In the depicted page/block structure, a first sub-group of pages (pages 0-7) in each layer Layer0-3 is grouped together in a single erase sub-block (Block 0), with additional sub-groups of pages (pages 8-15, 16-23, 24-31) in each layer Layer0-3 being grouped together, respectively, in additional, separate erase sub-blocks (Block 1, Block 2, Block 3), each of which may be individually erased as needed to clear space for writing new data to the blocks. As a result, the same amount of data as shown in FIG. 16 is now stored in four separately erasable blocks. In the initial state 491, the four blocks (Block 0, Block 1, Block 2, Block 3) are fully or partially filled with valid data and stale, invalid data, including invalid data in Block 0 (indicated with grey shaded boxes), valid data in Block 1 and Block 2 (indicated with boxes having left-to-right diagonal cross-hatch shading), and a mix of valid data and partially unprogrammed data in Block 3 (indicated with white boxes). As indicated with the second state 492, space for new data is obtained by erasing the invalid data from a first sub-block (Block 0) without also erasing the other sub-blocks. As a result, the free space in the first sub-block (Block 0) may be used to write new data. For example, the final state 493 shows that the freed space from the first sub-block (Block 0) and any other unprogrammed free space (for example, Block 3) may be written with new data (indicated with boxes having right-to-left diagonal cross-hatch shading).

With the compact erase block configuration and addressing scheme disclosed herein, new data can be written with reduced requirements for duplicating valid data at a different location (out of place write) by selectively applying erase operations to apply only to invalid data. The resulting reduction in the block size-to-page size ratio reduces the write amplification without the area penalty that would occur if the reduction were attempted by reducing the number of cells per string since each separate string requires space for non-data-bearing elements (for example, bit line contacts, source line contacts, string select transistors and ground select transistors) that do not contribute to the bit density of the memory device. Thus, the disclosed compact erase block configuration and addressing scheme minimizes the chip area required for non-data-bearing elements by effectively increasing the number of cells per string without imposing a write amplification penalty that would otherwise result. Stated another way, the design advantages of increasing the number of cells per strings in the vertical gate NAND flash memory (to minimize the area required for non-data-bearing elements) simultaneously imposes a performance cost of increased write amplification, and any attempt to reduce write amplification by cutting the string size in half to reduce the block size-to-page size ratio would run against this trend as the effective area that the non-data-bearing elements occupy would be doubled and bit density per area reduced.

In the vertical gate NAND flash system, apparatus, and fabrication method disclosed herein for providing a compact erase block configuration and addressing scheme, separate erase blocks are individually controlled by transmitting an erase voltage to a dedicated source line for the each erase block, whereby the connectivity of the cell array and these transmission source lines are designed in a way that a subset of these lines may be selected out of the entirety of erase voltage transmitting lines in a way that a subset of strings out of the entirety of strings belonging to one super block is erased. However, it will be appreciated that the disclosed cell array structure with a source line decoding and selection scheme for erase operation is not tied to any specific cell technology. For example, the compact erase block configuration and addressing scheme may be used with VG NAND flash memory devices where strings have a floating body enclosed at both ends by regions of different conductivity type and to VG NAND flash memory devices where the string bodies are not floating but are directly connected to a line which transmits the erase voltage during erase operation. Consequently, the charging of string bodies may occur through a reverse biased junction by GIDL current or by direct biasing. In addition, different biasing schemes may be used to generate bias conditions for erase operations than disclosed hereinabove. For example, the separately controlled source lines of unselected super blocks may be biased at the erase voltage or may be biased at 0 V, while the separately controlled string select transistor lines of unselected strings may be biased at a high pass voltage Vpass or may be left floating. Other row decoding schemes and row decoder circuits may also be used to generate the different bias conditions described herein for purposes of decoding the address bits for SSL lines to select a single SSL line and corresponding single source line for erasing NAND strings connected therebetween.

As described hereinabove, in each cell super block of the cell array, multiple separate source lines are connected to strings in a way that all strings that are connected to a first string select transistor line (for example, SSL0) are also connected to a corresponding first source line (for example, SL0), all strings that are connected to a second string select transistor line (for example, SSL1) are also connected to a second source line (for example, SL1), and so on. With this connection arrangement, the selection of strings by SSL lines for read and program operation has the same granularity as the selection of strings for erase operation. In other embodiments of the present disclosure, the number of source lines may differ and/or the strings connected to each source line may differ; however, the way in which the source lines connect to strings is not arbitrary since the strings which are connected to a specified SSL line are either identical to the strings which are connected to a corresponding or paired source line, or form a subset of all strings connected to a corresponding source line. In other words, all strings which are connected to one certain SSL line are connected to exactly one common source line. With this limitation, the strings which are connected to one certain SSL line will not include some strings connected to a first source line and other strings connected to a different second source line. On the other hand, the reverse case is possible wherein some strings which are connected to one certain source line are connected to a first SSL line, while other strings which are connected to the same source line are connected to a second SSL line.

Figure 18:
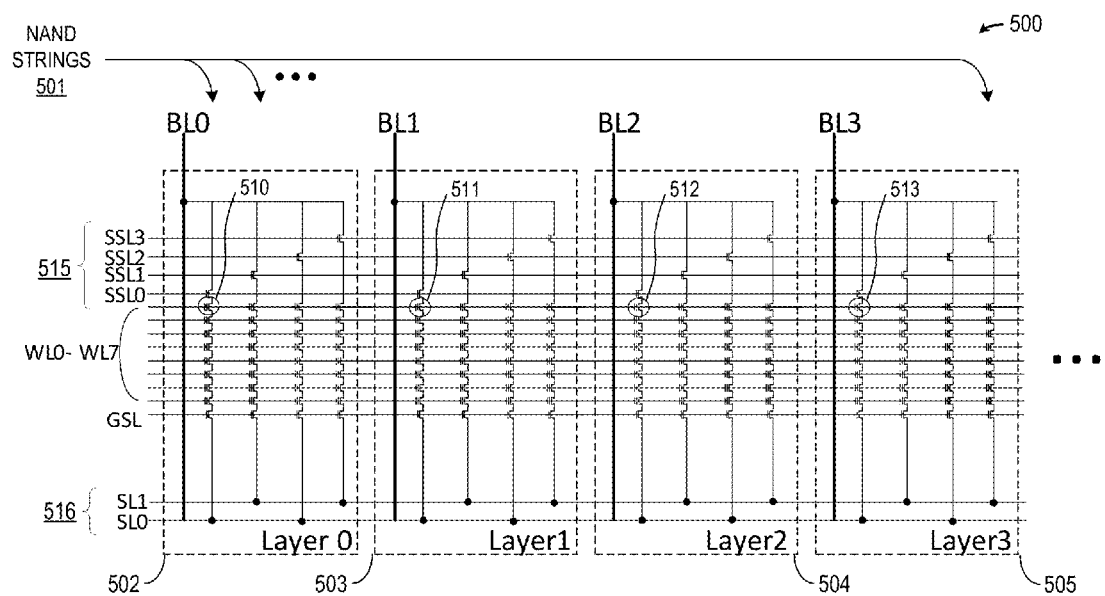
FIG. 18 is a simplified circuit schematic diagram illustrating the electrical connectivity of a vertical gate NAND flash memory cell array in accordance with selected embodiments where the number of SSL lines and source lines are different.

To illustrated selected example embodiments where the number of SSL lines and source lines are different, reference is now made to FIG. 18 which depicts a simplified circuit schematic diagram illustrating the electrical connectivity of a vertical gate NAND flash memory cell array 500 which uses two source lines and four string select transistors for implementing block erase operations in accordance with selected embodiments of the present disclosure. As illustrated, the array 500 includes a plurality (for example, 16) of NAND strings 501 which belong to a plurality (for example, 4) of vertically stacked layers 502-505 (for example, Layer0-Layer3) and which are connected in parallel between a plurality of bit lines BL0, BL1, BL2, BL3 and an alternating pair of source lines SL0, SL1. Though not shown, it will be appreciated that the array circuit 500 is repeated to the right with additional multi-layer structures being connected to the same word lines WL0-WL7 but to different bit lines. Each NAND string includes 8 cells connected in a vertical gate configuration to receive word lines WL0-WL7, respectively, and multiple cells stacked in a vertical direction may share the same fin-shaped word line and poly select gate. In addition, multiple strings belonging to the same vertical layer (for example, Layer0 502) share a single bit line (for example, BL0) through a horizontal bit line pad. To provide a lower granularity decoding arrangement for selecting a single string from the multiple strings that are connected to the same bit line, island-shaped SSL gates 515 are used to connect different NAND strings from each vertical layer to a respective bit line. Like the word lines WL0-WL7, the SSL gates 515 are shared by multiple strings in a vertical direction, but are not shared among adjacent strings in the horizontal direction (contrary to word lines). In addition, alternating NAND strings connected to a shared single bit line (for example, BL0) in each layer (for example, Layer0 502) are connected to a different source line (for example, SL0, SL1). As a result, strings that are connected to a specified source line (for example, SL0) are connected to either a first or second string select transistor (for example, SSL0 and SSL2) but not to the other string select transistors (for example, SSL1 or SSL3). In other words, all strings that are connected to SSL0 and SSL2 are connected only to SL0, but not SL1. This connection arrangement ensures that there are no pages having strings belonging to different erase blocks.

By now it should be appreciated that there is provided herein a three-dimensional integrated circuit non-volatile memory array wherein erase blocks in a super block may be separately erased by supplying an erase voltage to a dedicated source line structure for the erase block. The disclosed memory device includes a memory array having vertical gate NAND memory cell strings, including a first plurality of NAND memory cell strings forming a first erase block and second plurality of NAND memory cell strings forming a second erase block, that is formed in a plurality of different layers over a substrate and sharing a common set of word lines. The memory array is divided into a plurality of groups of memory blocks, each group sharing a common set of word lines and being divided into separately erasable erase blocks. Each erase block includes a plurality of vertical gate NAND memory cell strings vertically stacked together and connected between a dedicated erase block selection structure which includes a source line structure and a string select structure. The memory device also includes a first source line structure and one or more first string select structures connected respectively on opposite ends of the first plurality of NAND memory cell strings, where the first source line structure controls erasure of the first erase block. In addition, the memory device includes a second source line structure and one or more second string select structures connected respectively on opposite ends of the second plurality of NAND memory cell strings, where the second source line structure controls erasure of the second erase block. In selected embodiments, the first source line structure is electrically connected to a source end of the first plurality of NAND memory cell strings formed in the plurality of different layers for providing an erase voltage V_erase to the first plurality of NAND memory cell strings during erasure of the first erase block. In addition, the first string select structure may be implemented as an island-type string select transistor electrically connected to a drain end of the first plurality of NAND memory cell strings formed in the plurality of different layers for receiving a first string select signal at a gate electrode of the first island-type string select transistor to control connections of the first plurality of NAND memory cell strings formed in a plurality of different layers to the plurality of bit lines. Alternatively, the first string select structures may be implemented with first and second island-type string select transistors. The first island-type string select transistor is electrically connected to a drain end of a first subset of the first plurality of NAND memory cell strings formed in the plurality of different layers for receiving a first string select signal at a gate electrode of the first island-type string select transistor to control connections of the first plurality of NAND memory cell strings formed in a plurality of different layers to a plurality of bit lines. Similarly, the second island-type string select transistor is electrically connected to a drain end of a second subset of the first plurality of NAND memory cell strings formed in the plurality of different layers for receiving a second string select signal at a gate electrode of the second island-type string select transistor to control connections of the second plurality of NAND memory cell strings formed in a plurality of different layers to the plurality of bit lines. Each vertical gate NAND memory cell string may be a semiconductor strip with a plurality of word line gate conductors formed around the semiconductor strip to define a plurality of memory cells running parallel to an upper surface of the substrate. In addition, each vertical gate NAND memory cell string may be a floating semiconductor body formed with a first conductivity type material and enclosed on peripheral drain and source end regions with a diffusion layer of opposite conductivity type material, in which case the NAND memory cell strings forming an erase block are erased by positively charging each floating semiconductor body with hole injection created by gate induced drain leakage (GIDL) at a reverse biased n-p junction at either or both the peripheral drain or source end regions. In other embodiments, each vertical gate NAND memory cell string may be a semiconductor body that is formed with a first conductivity type material and that is connected directly to a dedicated source line structure, in which case the NAND memory cell strings forming an erase block may be erased by positively charging each semiconductor body through the dedicated source line structure. In other embodiments, each vertical gate NAND memory cell string may be a semiconductor body formed with a first conductivity type material and enclosed on peripheral drain and source end regions with a diffusion layer of opposite conductivity type material, wherein a source line structure is positioned to short the semiconductor body and source end region so that the source line structure is directly connected to the semiconductor body. In other embodiments, each vertical gate NAND memory cell string is formed as a patterned polysilicon layer having a peripheral drain region formed with a first conductivity type material, a floating interior body region formed with an opposite conductivity type material, and peripheral source end region formed with the first conductivity type material, in which case the first source line structure may be formed as a metal-based conductor layer for providing an erase voltage V_erase to the peripheral source end region when erasing the first plurality of NAND memory cell strings. In such embodiments, the first plurality of NAND memory cell strings may be erased by positively charging each floating interior body region of said first plurality of NAND memory cell strings with hole injection created by gate induced drain leakage (GIDL) at a reverse biased n-p junction between the floating interior body region and the peripheral or source end region of each said first plurality of NAND memory cell strings. A source line selection circuit in the memory device selects between the first source line structure and the second source line structure when erasing the first erase block or second erase block. The source line selection circuit may be implemented as a row decoder circuit for selecting one or more erase blocks of memory cells for erase operation, where the row decoder circuit includes a first block decoder and a selection circuit. The first block decoder processes M row address bits to select a group of blocks of memory cells in the memory array which share a common set of word lines from amongst a plurality of groups of blocks of memory cells in the memory array. The selection circuit processes L row address bits to select a source line structure from a plurality of source line structures in the selected group of blocks, thereby selecting a plurality of NAND memory cell strings connected to the selected source line structure as an erase block of memory cells for erase operation. In selected embodiments, the selection circuit includes a row address decoder for generating a selection signal that is selected from $2^L$ selection signals; a source line voltage switching circuit for processing the selection signal as a source line select signal to generate an erase voltage V_erase for connection to the selected source line structure; and a string select structure voltage switching circuit for processing the selection signal as a string select signal to generate a high pass voltage Vpass for connection to the selected string select structure. In other embodiments, the selection circuit may be implemented as a row decoder circuit for supplying an erase voltage V_erase to only the first source line structure and not the second source line structure when erasing the first erase block.

In other embodiments, there is disclosed method for selectively erasing blocks of vertical gate stacked NAND strings. In the disclosed methodology, a first erase block of vertical gate stacked NAND memory strings is erased in a first memory array block having a plurality of separately erasable erase blocks sharing a common set of word lines by selectively applying a first erase voltage to only a first source line structure connected to the first erase block of vertical gate stacked NAND memory strings. Simultaneously, a second voltage may be applied to each additional source line structure connected to each additional erase block from the plurality of separately erasable erase blocks to prevent erasure of each additional erase block. In addition, a third high pass voltage is simultaneously applied to one or more first string select structures connected to the first erase block of vertical gate stacked NAND memory strings, alone or in combination with simultaneously applying a ground voltage to the common set of word lines. In selected embodiments, the first erase block of vertical gate stacked NAND memory strings is erased by positively charging floating body portions of the vertical gate stacked NAND memory strings having a first conductivity type through hole injection created by applying the first erase voltage to drain or source end portions of the vertical gate stacked NAND memory strings to create reverse biased n-p junctions in the vertical gate stacked NAND memory strings. In other embodiments, the first erase block of vertical gate stacked NAND memory strings is erased by positively charging body portions of the vertical gate stacked NAND memory strings having a first conductivity type by applying the first erase voltage to a first source line structure that is connected to the source end portions of the vertical gate stacked NAND memory strings. To erase the first erase block, a row address may be received which includes block address bits and page address bits. The row address is decoded to select the first memory array block from a plurality of memory array blocks, where each memory array block includes a plurality of vertical gate stacked NAND memory cell strings organized as a plurality of separately erasable erase blocks sharing a common set of word lines which are not shared with other memory array blocks. In addition, the row address is decoded to select a first erase block from the plurality of separately erasable erase blocks in the selected first memory array block, where each erase block includes a plurality of vertical gate stacked NAND memory cell strings connected between a separately selectable pairing of a source line structure and one or more string select structures. To erase the first erase block, the first erase voltage and a second high pass voltage are applied, respectively, to a first source line structure and one or more first string select structures for the first erase block to erase the plurality of vertical gate stacked NAND memory cell strings connected between the first source line structure and one or more first string select structures.

In yet another form, there is provided memory device and associated method of manufacture and operation. The disclosed memory device includes a 3D array of memory cells formed over a substrate as a plurality of stacks of vertical gate NAND memory cell strings sharing a common set of word lines, wherein each stack includes a plurality of vertically stacked NAND memory cell strings connected between a dedicated source line structure and one or more string select structures with each of the plurality of vertically stacked NAND memory cell strings. Each NAND string may be formed as a floating semiconductor body formed with a first conductivity type material and enclosed on peripheral drain and source end regions with a diffusion layer of opposite conductivity type material. The memory device also includes an erase block selection circuit for selectively erasing a first stack of vertical gate NAND memory cell strings in the 3D array as a first erase block by selectively applying a first erase voltage to only a first source line structure connected to the first stack of vertical gate NAND memory cell strings. In operation, the erase block selection circuit selectively erases the first stack of vertical gate NAND memory cell strings by simultaneously applying a second voltage to each additional source line structure connected respectively to each additional stack from the plurality of stacks of vertical gate NAND memory cell strings to prevent erasure of each additional stack.

Although the described exemplary embodiments disclosed herein are directed to various non-volatile memory device structures and methods for making and operating same by forming dedicated pairings of source line and string select structures for each erase block so that an erase voltage may be applied to only the source line of the block being erased, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the NAND cell transistors are described as n-channel transistors on p-type (or undoped) substrate, this is merely for illustration purposes, and it will be appreciated that n and p-type impurities may be interchanged so as to form p-channel transistors on n-type substrate, or the substrate may consist of undoped silicon. In addition, the flash memory cells are illustrated herein as being embodied as vertical gate NAND memory cell strings, but this is merely for convenience of explanation and not intended to be limiting and persons of skill in the art will understand that the principles taught herein apply to other suitable kinds of cell structures and the resulting different bias conditions. Moreover, the bias conditions described herein are understood to be only an example out of a plurality of different possible biasing schemes. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," "includes," "including," "has," "having," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A three-dimensional non-volatile memory device, comprising:
    a memory array comprising a plurality of vertical gate NAND memory cell strings formed in a plurality of different layers over a substrate and sharing a common set of word lines, comprising a first plurality of NAND memory cell strings forming a first erase block and second plurality of NAND memory cell strings forming a second erase block;
    a first source line structure and one or more first string select structures connected respectively on opposite ends of the first plurality of NAND memory cell strings, where the first source line structure controls erasure of the first erase block;
    a second source line structure and one or more second string select structures connected respectively on opposite ends of the second plurality of NAND memory cell strings, where the second source line structure controls erasure of the second erase block; and
    a source line selection circuit for selecting between the first source line structure and the second source line structure when erasing the first erase block or second erase block.

2. The three-dimensional non-volatile memory device of claim 1, where the source line selection circuit comprises a row decoder circuit for selecting one or more erase blocks of memory cells for erase operation comprising:
    a first block decoder for processing M row address bits to select a group of blocks of memory cells in the memory array which share a common set of word lines from amongst a plurality of groups of blocks of memory cells in the memory array; and
    a selection circuit for processing L row address bits to select a source line structure from a plurality of source line structures in the selected group of blocks, thereby selecting a plurality of NAND memory cell strings connected to the selected source line structure as an erase block of memory cells for erase operation.

3. The three-dimensional non-volatile memory device of claim 2, where the selection circuit comprises:
    a row address decoder for generating a selection signal that is selected from $2^L$ selection signals;
    a source line voltage switching circuit for processing the selection signal as a source line select signal to generate an erase voltage V_erase for connection to the selected source line structure; and
    a string select structure voltage switching circuit for processing the selection signal as a string select signal to generate a high pass voltage Vpass for connection to the selected string select structure.

4. The three-dimensional non-volatile memory device of claim 1, further comprising a row decoder circuit for supplying an erase voltage V_erase to only the first source line structure and not the second source line structure when erasing the first erase block.

5. The three-dimensional non-volatile memory device of claim 1, where the first source line structure and one or more first string select structures comprise, respectively:
    a first source line structure electrically connected to a source end of the first plurality of NAND memory cell strings formed in the plurality of different layers for providing an erase voltage V_erase to the first plurality of NAND memory cell strings during erasure of the first erase block; and
    a first island-type string select transistor electrically connected to a drain end of the first plurality of NAND memory cell strings formed in the plurality of different layers for receiving a first string select signal at a gate electrode of the first island-type string select transistor to control connections of the first plurality of NAND memory cell strings formed in a plurality of different layers to the plurality of bit lines.

6. The three-dimensional non-volatile memory device of claim 1, where the first source line structure and one or more first string select structures comprise, respectively:
    a first source line structure electrically connected to a source end of the first plurality of NAND memory cell strings formed in the plurality of different layers for providing an erase voltage V_erase to the first plurality of NAND memory cell strings during erasure of the first erase block;

first island-type string select transistor electrically connected to a drain end of a first subset of the first plurality of NAND memory cell strings formed in the plurality of different layers for receiving a first string select signal at a gate electrode of the first island-type string select transistor to control connections of the first plurality of NAND memory cell strings formed in a plurality of different layers to a plurality of bit lines; and a second island-type string select transistor electrically connected to a drain end of a second subset of the first plurality of NAND memory cell strings formed in the plurality of different layers for receiving a second string select signal at a gate electrode of the second island-type string select transistor to control connections of the second plurality of NAND memory cell strings formed in a plurality of different layers to the plurality of bit lines.

7. The three-dimensional non-volatile memory device of claim 1, wherein each vertical gate NAND memory cell string comprises a semiconductor strip with a plurality of word line gate conductors formed around the semiconductor strip to define a plurality of memory cells running parallel to an upper surface of the substrate.

8. The three-dimensional non-volatile memory device of claim 1, wherein each vertical gate NAND memory cell string comprises a floating semiconductor body formed with a first conductivity type material and enclosed on peripheral drain and source end regions with a diffusion layer of opposite conductivity type material.

9. The three-dimensional non-volatile memory device of claim 8, wherein a plurality of NAND memory cell strings forming an erase block are erased by positively charging each floating semiconductor body with hole injection created by gate induced drain leakage (GIDL) at a reverse biased n-p junction at either or both the peripheral drain or source end regions.

10. The three-dimensional non-volatile memory device of claim 1, wherein each vertical gate NAND memory cell string comprises a semiconductor body that is formed with a first conductivity type material and that is connected directly to a dedicated source line structure.

11. The three-dimensional non-volatile memory device of claim 10, wherein a plurality of NAND memory cell strings forming an erase block are erased by positively charging each semiconductor body through the dedicated source line structure.

12. The three-dimensional non-volatile memory device of claim 1, wherein each vertical gate NAND memory cell string comprises a semiconductor body formed with a first conductivity type material and enclosed on peripheral drain and source end regions with a diffusion layer of opposite conductivity type material, and wherein a source line structure is positioned to short the semiconductor body and source end region so that the source line structure is directly connected to the semiconductor body.

13. The three-dimensional non-volatile memory device of claim 1, wherein the memory array is divided into a plurality of groups of memory blocks, each group of which shares a common set of word lines and is divided into a plurality of separately erasable erase blocks, each of which comprises a plurality of vertical gate NAND memory cell strings vertically stacked together and connected between a dedicated erase block selection structure comprising a source line structure and a string select structure.

14. The three-dimensional non-volatile memory device of claim 1, where each vertical gate NAND memory cell string comprises a patterned polysilicon layer comprising a peripheral drain region formed with a first conductivity type material, a floating interior body region formed with an opposite conductivity type material, and peripheral source end region formed with the first conductivity type material; where the first source line structure comprises a metal-based conductor layer for providing an erase voltage V_erase to the peripheral source end region when erasing the first plurality of NAND memory cell strings.

15. The three-dimensional non-volatile memory device of claim 14, wherein the first plurality of NAND memory cell strings are erased by positively charging each floating interior body region of said first plurality of NAND memory cell strings with hole injection created by gate induced drain leakage (GIDL) at a reverse biased n-p junction between the floating interior body region and the peripheral or source end region of each said first plurality of NAND memory cell strings.

16. A memory device, comprising:
a substrate;
a 3D array of memory cells over the substrate comprising a plurality of stacks of vertical gate NAND memory cell strings sharing a common set of word lines, wherein each stack comprises a plurality of vertically stacked NAND memory cell strings connected between a dedicated source line structure and one or more string select structures with each of the plurality of vertically stacked NAND memory cell strings comprising a floating semiconductor body formed with a first conductivity type material and enclosed on peripheral drain and source end regions with a diffusion layer of opposite conductivity type material; and
an erase block selection circuit for selectively erasing a first stack of vertical gate NAND memory cell strings in the 3D array as a first erase block by selectively applying a first erase voltage to only a first source line structure connected to the first stack of vertical gate NAND memory cell strings.

17. The memory device of claim 16, where the erase block selection circuit selectively erases the first stack of vertical gate NAND memory cell strings by simultaneously applying a second voltage to each additional source line structure connected respectively to each additional stack from the plurality of stacks of vertical gate NAND memory cell strings to prevent erasure of each additional stack.

18. A three-dimensional non-volatile memory device, comprising:
a semiconductor substrate having an upper surface;
a first group of cell strings that includes at least two cell strings;
a second group of cell strings that includes at least two cell strings, the first and second groups of cell strings:
i) being formed above the upper surface of the semiconductor substrate;
ii) being adjacent to each other in a direction horizontal to the upper surface of the semiconductor substrate; and
iii) sharing a common set of word lines, and
the first group of cell strings further including a first string select gate electrode and a first source node, and the second group of cell strings further including a second string select gate electrode and a second source node, and the first string select gate electrode being connected to a first string select structure extending in a direction parallel to the common set of word lines, and the second string select gate electrode being connected to a second string select structure extending in a direction parallel to the common set of word lines, and the first source node being connected to a first source line structure extending in a direction parallel to the common set of word lines, and the second source node being connected to a second source line structure extending in a direction parallel to the common set of word lines, and wherein the first and second source line structures are different from each other and are comprised of conductive lines above the upper surface of the substrate and including at least one of a metal or a metal silicide.

19. The three-dimensional non-volatile memory device of claim 18, wherein the first group of cell strings is a first stack, the second group of cell strings is a second stack, and the first stack includes a first and second cell string, the second stack includes a third and fourth cell string, and each of the first to fourth cell strings extend in a direction horizontal to the upper surface of the substrate, and the second cell string being stacked over the first cell string, and the fourth cell string being stacked over the third cell string.

20. The three-dimensional non-volatile memory device of claim 18, wherein the cell strings of the first and second groups of cell strings are NAND memory cell strings, and wherein the first stack is part of a first erase block, and the second stack is part of a second erase block, and wherein the first source line structure controls erasure of the first erase block, the second source line structure controls erasure of the second erase block.

21. The three-dimensional non-volatile memory device of claim 20 further comprising:

a source line selection circuit for selecting between the first source line structure and the second source line structure when erasing the first erase block or second erase block.

* * * * *